(12) United States Patent
Nakamura

(10) Patent No.: US 7,585,904 B2
(45) Date of Patent: Sep. 8, 2009

(54) CURING ACCELERATOR, CURABLE RESIN COMPOSITION AND ELECTRONIC PARTS DEVICE

(75) Inventor: Shinya Nakamura, Tsukuba (JP)

(73) Assignee: Hitachi Chemical Company, Ltd., Tokyo (JP)

( * ) Notice: Subject to any disclaimer, the term of this patent is extended or adjusted under 35 U.S.C. 154(b) by 209 days.

(21) Appl. No.: 11/814,832

(22) PCT Filed: Jan. 23, 2006

(86) PCT No.: PCT/JP2006/300945

§ 371 (c)(1),
(2), (4) Date: Jul. 26, 2007

(87) PCT Pub. No.: WO2006/080270

PCT Pub. Date: Aug. 3, 2006

(65) Prior Publication Data

US 2009/0012232 A1    Jan. 8, 2009

(30) Foreign Application Priority Data

Jan. 26, 2005    (JP) .............................. 2005-018598

(51) Int. Cl.
*C08L 63/00*    (2006.01)
*C08K 5/50*    (2006.01)
*C08K 5/5419*    (2006.01)

(52) U.S. Cl. .................... 523/451; 524/154; 524/262

(58) Field of Classification Search ................. 523/451; 524/154, 262
See application file for complete search history.

(56) References Cited

FOREIGN PATENT DOCUMENTS

| JP | 09-157497 | 6/1997 |
|---|---|---|
| JP | 2001-139661 | 5/2001 |
| JP | 2004-156035 | 6/2004 |
| JP | 2004-156036 | 6/2004 |
| JP | 2004-176039 | 6/2004 |

OTHER PUBLICATIONS

International Search Report of International Application No. PCT/JP2006/300945, completed Mar. 8, 2006.

*Primary Examiner*—Peter Szekely
(74) *Attorney, Agent, or Firm*—Antonelli, Terry, Stout & Kraus, LLP.

(57) ABSTRACT

A curing accelerator that enables a composition to exhibit excellent fluidity, reflow crack resistance and high-temperature storage properties, and exhibits excellent curability even upon moisture absorption, as well as a curable resin composition, and an electronic parts device comprising an element that has been encapsulated using the curable resin composition. The curable resin composition is prepared using a curing accelerator comprising a compound represented by a formula (I) shown below.

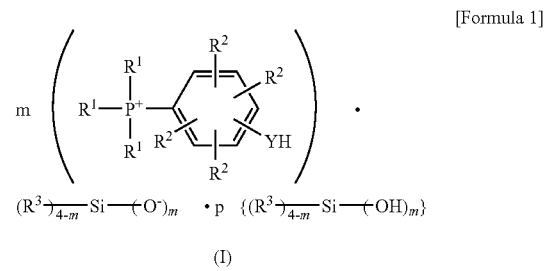

(wherein, $R^1$ is selected from the group consisting of a hydrogen atom, and substituted or unsubstituted hydrocarbon groups of 1 to 18 carbon atoms, two or more $R^1$ groups may be bonded together to form a cyclic structure, $R^2$ and $R^3$ are selected from the group consisting of a hydrogen atom, a hydroxyl group, and substituted or unsubstituted organic groups of 1 to 18 carbon atoms, two or more $R^2$ or $R^3$ groups may be bonded together to form a cyclic structure, YH represents an organic group of 0 to 18 carbon atoms containing one or more releasable protons ($H^+$), and may be bonded to one or more $R^2$ groups to form a cyclic structure, m represents an integer from 1 to 4, and p represents a number of 0 or greater).

18 Claims, 21 Drawing Sheets

CURING ACCELERATOR, CURABLE RESIN COMPOSITION AND ELECTRONIC PARTS DEVICE

TECHNICAL FIELD

The present invention relates to a curing accelerator, a molding material comprising the curing accelerator, a curable resin composition that is suitable as a material for laminates and adhesives, and an electronic parts device comprising an element that has been encapsulated using such a curable resin composition.

BACKGROUND ART

Conventionally, curable resins such as epoxy resins have been widely used in fields such as molding materials, and materials for laminates and adhesives. Because rapid curability of these curable resins is desirable from the viewpoint of improving productivity, compounds that accelerate the curing reaction, namely curing accelerators, are commonly added to the curable resin compositions. For example, in the technical field associated with the encapsulating of elements of electronic parts such as transistors and ICs, of the various possible curable resins, compositions that use an epoxy resin as the base resin are particularly widely used. The reason for this widespread use is that epoxy resins offer a favorable balance over a wide range of properties, including moldability, electrical properties, moisture resistance, heat resistance, mechanical properties, and the level of adhesion to inserts. Combinations of an ortho-cresol novolac epoxy resin and a phenol novolac curing agent offer a particularly superior balance of the above properties, and are consequently the most widely used base resins for molding materials used for IC encapsulation. Curing accelerators including amine compounds such as tertiary amines or imidazoles, and phosphorus compounds such as phosphines or phosphonium compounds are typically used in these epoxy resin compositions.

However in recent years, in the field of encapsulating elements of electronic parts, there is a growing trend towards higher density packaging of electronic parts on printed wiring boards, and accompanying this trend, surface-mounted packages are gradually becoming more common than conventional pin insertion-type packages. However, compared with pin insertion-type packages, surface-mounted packages tend to exhibit inferior resistance to package cracking during soldering, so-called reflow crack resistance. In other words, in surface mounted ICs such as IC and LSI, the element-occupied volume within the package is being gradually increased in order to increase the packaging density, meaning the thickness of the package wall is becoming extremely thin. Moreover, surface-mounted packages are exposed to more severe conditions during soldering than pin insertion-type packages.

Specifically, in the case of a pin insertion-type package, the pins are inserted into the wiring board, and soldering is then conducted from the underside of the wiring board, and consequently the package is not exposed directly to high temperatures. In contrast, in the case of a surface-mounted IC, the IC is temporarily secured to the surface of the wiring board, and treatment is then conducted in a solder bath or a reflow apparatus, meaning the package is exposed directly to the high soldering temperature. As a result, if the IC package has absorbed moisture, then this absorbed moisture expands rapidly during soldering, and may cause cracks within the package, which represents a significant problem during package molding.

As a result of these circumstances, in order to improve the reflow crack resistance of surface-mounted packages, epoxy resin compositions containing increased quantities of inorganic fillers have been reported. However, as the quantity of inorganic fillers is increased, the fluidity of the resin composition deteriorates, which often leads to a deterioration in the performance of the package, including molding problems such as the generation of filling defects or voids upon molding, or conduction faults caused by breakage of the IC chip bonding wires. Accordingly, there has been a limit to how far the quantity of inorganic fillers can be increased, meaning achieving significant improvements in the reflow crack resistance has been difficult. Particularly in those cases where a phosphorus-based curing accelerator such as triphenylphosphine or an amine-based curing accelerator such as 1,8-diazabicyclo[5.4.0]undecene-7 is added to the above type of epoxy resin in order to improve the curing rate, a significant deterioration in the fluidity of the resin composition tends to be caused. As a result, in addition to improvements in the reflow crack resistance of packages, improvements in the fluidity of resin compositions is also currently sought.

In order to improve the fluidity of epoxy resin compositions comprising a high proportion of an inorganic filler, Japanese Patent Laid-Open No. H09-157497 proposes a method that uses the addition reaction product of triphenylphosphine and 1,4-benzoquinone as a curing accelerator. In other methods, Japanese Patent Laid-Open No. 2004-156035 and Japanese Patent Laid-Open No. 2004-156036 propose methods that use phosphoniophenolates as the curing accelerator.

DISCLOSURE OF INVENTION

However, in recent years, environmental reasons have seen the emergence of a movement within the field of surface-mounted packages to restrict the quantity of halogen-containing flame retardants used within encapsulating epoxy resin compositions. As a result, in order to ensure a high level of package flame retardancy without the use of such flame retardants, and in order to improve the thermal conductivity of the packages, the quantity of inorganic fillers added to the resin compositions has tended to increase even further. Under these circumstances, even if one of the proposed phosphorus-based curing accelerators is used to moderate the reduction in fluidity of the encapsulating epoxy resin composition, achieving a satisfactory level of fluidity tends to be difficult. As a result, the development of a curing accelerator that ensures favorable properties, and particularly a favorable fluidity, is keenly sought.

Accordingly, an object of the present invention is to provide a curing accelerator which is capable of imparting excellent fluidity, reflow crack resistance and high-temperature storage properties, and which exhibits excellent curability even upon moisture absorption, as well as a curable resin composition comprising such a curing accelerator, and an electronic parts device comprising an element that has been encapsulated using such a curable resin composition.

As a result of intensive investigation aimed at resolving the problems outlined above, the inventors of the present invention discovered that by using a specific phosphorus compound as a curing accelerator, a curable resin composition with excellent levels of curability upon moisture absorption, fluidity, and reflow crack resistance could be obtained, enabling the desired object to be achieved, and they were therefore able to complete the present invention.

Aspects of the present invention are described below.

A first aspect of the present invention relates to a curing accelerator comprising a compound represented by a general formula (I). In the general formula (I), YH is preferably a monovalent organic group containing a hydroxyl group or a phenolic hydroxyl group.

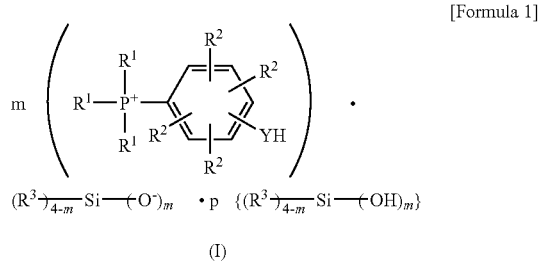

(I)

(wherein, each $R^1$ is selected, independently, from the group consisting of a hydrogen atom and substituted or unsubstituted hydrocarbon groups of 1 to 18 carbon atoms, the $R^1$ groups may be either all the same or different, and two or more $R^1$ groups may be bonded together to form a cyclic structure, each $R^2$ is selected, independently, from the group consisting of a hydrogen atom, a hydroxyl group, and substituted or unsubstituted organic groups of 1 to 18 carbon atoms, the $R^2$ groups may be either all the same or different, and two or more $R^2$ groups may be bonded together to form a cyclic structure, each $R^3$ is selected, independently, from the group consisting of a hydrogen atom, a hydroxyl group, and substituted or unsubstituted organic groups of 1 to 18 carbon atoms, the $R^3$ groups may be either all the same or different, and two or more $R^3$ groups may be bonded together to form a cyclic structure, YH represents an organic group of 0 to 18 carbon atoms containing one or more releasable protons ($H^+$), and may be bonded to one or more $R^2$ groups to form a cyclic structure, m represents an integer from 1 to 4, and p represents a number of 0 or greater)

Another aspect of the present invention relates to a curing accelerator comprising a reaction product of an intramolecular phosphonium salt represented by a general formula (Ia) shown below, and a silanol compound (Ib) represented by a general formula shown below. In the general formula (Ia), $Y^-$ is preferably a group obtained by eliminating a proton from a monovalent organic group containing a hydroxyl group or a phenolic hydroxyl group.

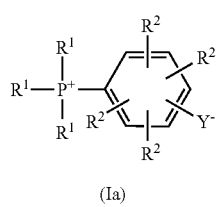

(Ia)

(wherein, each $R^1$ is selected, independently, from the group consisting of a hydrogen atom and substituted or unsubstituted hydrocarbon groups of 1 to 18 carbon atoms, the $R^1$ groups may be either all the same or different, and two or more $R^1$ groups may be bonded together to form a cyclic structure, each $R^2$ is selected, independently, from the group consisting of a hydrogen atom, a hydroxyl group, and substituted or unsubstituted organic groups of 1 to 18 carbon atoms, the $R^2$ groups may be either all the same or different, and two or more $R^2$ groups may be bonded together to form a cyclic structure, $Y^-$ represents an organic group formed by eliminating one proton from an organic group of 0 to 18 carbon atoms containing one or more releasable protons ($H^+$), and may be bonded to one or more $R^2$ groups to form a cyclic structure)

(Ib)

(wherein, each $R^3$ is selected, independently, from the group consisting of a hydrogen atom, a hydroxyl group, and substituted or unsubstituted organic groups of 1 to 18 carbon atoms, the $R^3$ groups may be either all the same or different, and two or more $R^3$ groups may be bonded together to form a cyclic structure, and m represents an integer from 1 to 4)

Yet another aspect of the present invention relates to a curable resin composition comprising (A) one or more curing accelerators according to the present invention, and (B) a curable resin. The curable resin (B) preferably comprises an epoxy resin, and the epoxy resin contained within the curable resin (B) preferably comprises one or more epoxy resins selected from the group consisting of biphenyl epoxy resins, stilbene epoxy resins, diphenylmethane epoxy resins, sulfur atom-containing epoxy resins, novolac epoxy resins, dicyclopentadiene epoxy resins, salicylaldehyde epoxy resins, copolymer epoxy resins of a napthol and a phenol, and epoxidized products of aralkyl phenolic resins. Furthermore, the curable resin composition of the present invention may further comprise a curing agent (C) and/or an inorganic filler (D). Furthermore, the curing agent (C) preferably comprises one or more resins selected from the group consisting of aralkyl phenolic resins, dicyclopentadiene phenolic resins, salicylaldehyde phenolic resins, copolymer resins of a benzaldehyde phenolic resin and an aralkyl phenolic resin, and novolac phenolic resins.

Yet another aspect of the present invention relates to an electronic parts device comprising an element that has been encapsulated using a curable resin composition according to the present invention.

Because a curing accelerator of an aspect of the present invention is capable of imparting excellent fluidity, curability, reflow crack resistance, and high-temperature storage properties, a curable resin composition prepared using such a curing accelerator exhibits excellent curability upon moisture absorption, as well as a range of other excellent properties such as fluidity. Furthermore, if an element of an electronic part such as an IC or LSI is encapsulated using this type of curable resin composition, then as is evident from the examples described below, an electronic parts device with favorable reflow crack resistance and high-temperature storage properties, and excellent reliability can be provided, and the industrial value of such a parts device is very high. This application is based upon and claims the benefit of priority from prior Japanese Application 2005-018598 filed on Jan. 26, 2005, the entire contents of which are incorporated herein by reference.

BEST MODE FOR CARRYING OUT THE INVENTION

Figure 1:
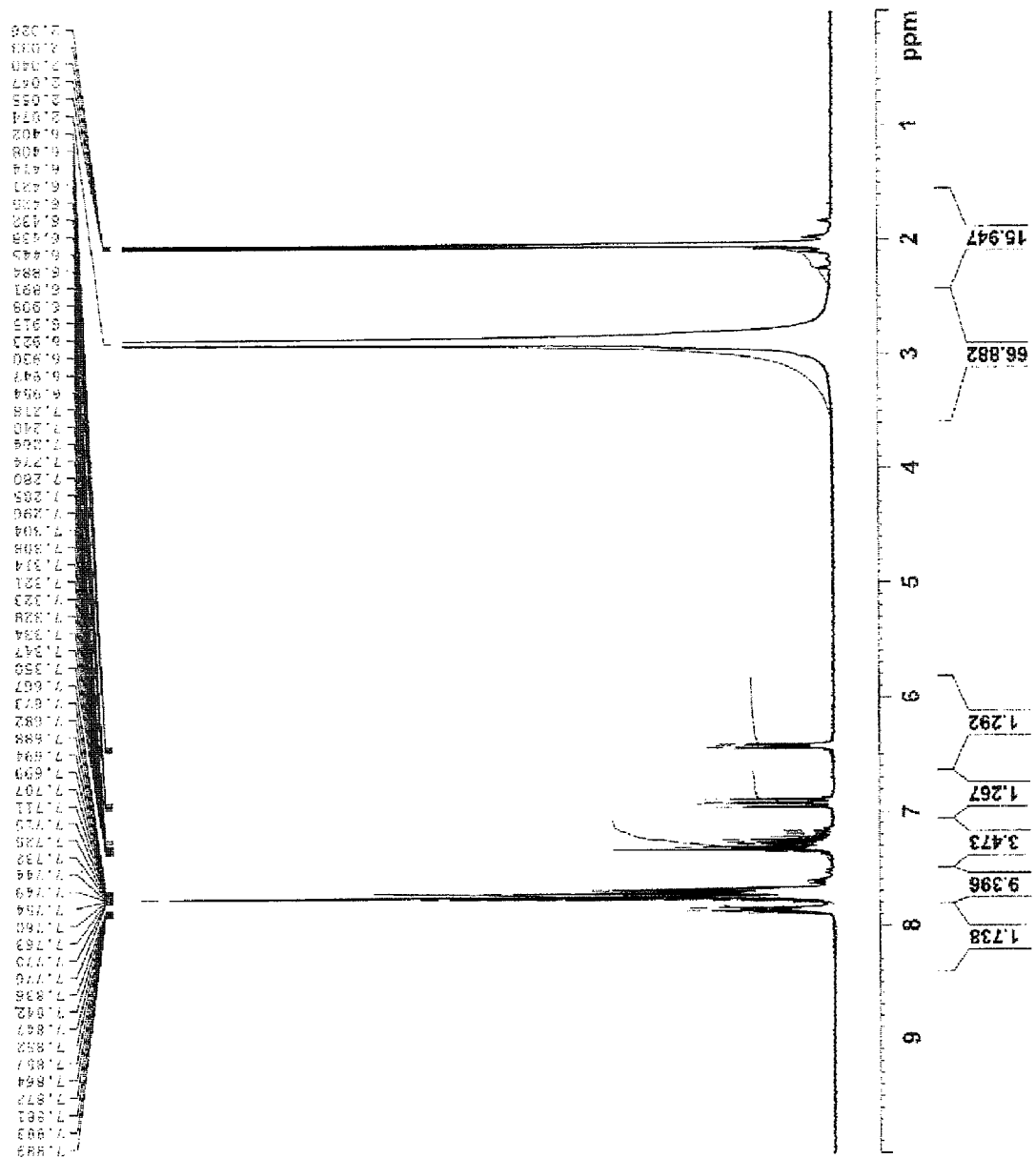
FIG. 1 is a $^1$H-NMR spectrum of a compound 1 prepared as a curing accelerator according to the present invention.

As follows is a detailed description of embodiments of the present invention.

[Curing Accelerator]

A curing accelerator that represents one aspect of the present invention can be used effectively in accelerating the curing of a curable resin, and comprises a compound represented by a general formula (I) shown below.

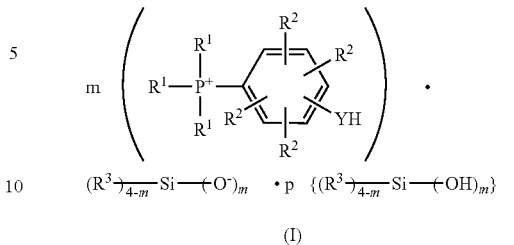

[Formula 4]

(I)

(wherein, each $R^1$ is selected, independently, from the group consisting of a hydrogen atom and substituted or unsubstituted hydrocarbon groups of 1 to 18 carbon atoms, the $R^1$ groups may be either all the same or different, and two or more $R^1$ groups may be bonded together to form a cyclic structure, each $R^2$ is selected, independently, from the group consisting of a hydrogen atom, a hydroxyl group, and substituted or unsubstituted organic groups of 1 to 18 carbon atoms, the $R^2$ groups may be either all the same or different, and two or more $R^2$ groups may be bonded together to form a cyclic structure, each $R^3$ is selected, independently, from the group consisting of a hydrogen atom, a hydroxyl group, and substituted or unsubstituted organic groups of 1 to 18 carbon atoms, the $R^3$ groups may be either all the same or different, and two or more $R^3$ groups may be bonded together to form a cyclic structure, YH represents an organic group of 0 to 18 carbon atoms containing one or more releasable protons (H$^+$), and may be bonded to one or more $R^2$ groups to form a cyclic structure, m represents an integer from 1 to 4, and p represents a number of 0 or greater)

The compound represented by the above general formula (I) may be prepared by any production method, using any starting raw materials, provided the targeted compound is obtained. For example, the above compound can be prepared as the reaction product of an intramolecular phosphonium salt represented by a general formula (Ia) shown below, and a silanol compound (Ib) represented by a general formula shown below. In other words, another aspect of the present invention relates to a curing accelerator comprising the reaction product of the general formulas (Ia) and (Ib) shown below.

[Formula 5]

(Ia)

(wherein, each $R^1$ is selected, independently, from the group consisting of a hydrogen atom and substituted or unsubstituted hydrocarbon groups of 1 to 18 carbon atoms, the $R^1$ groups may be either all the same or different, and two or more $R^1$ groups may be bonded together to form a cyclic structure, each R² is selected, independently, from the group consisting of a hydrogen atom, a hydroxyl group, and substituted or unsubstituted organic groups of 1 to 18 carbon atoms, the R² groups may be either all the same or different, and two or more R² groups may be bonded together to form a cyclic structure, Y⁻ represents an organic group formed by eliminating one proton from an organic group of 0 to 18 carbon atoms containing one or more releasable protons (H⁺), and may be bonded to one or more R² groups to form a cyclic structure)

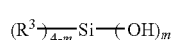

[Formula 6]

(Ib)

(wherein, each R³ is selected, independently, from the group consisting of a hydrogen atom, a hydroxyl group, and substituted or unsubstituted organic groups of 1 to 18 carbon atoms, the R³ groups may be either all the same or different, and two or more R³ groups may be bonded together to form a cyclic structure, and m represents an integer from 1 to 4)

The expression "substituted or unsubstituted hydrocarbon group of 1 to 18 carbon atoms" used in relation to R¹ within the above general formulas (I) and (Ia) describes aliphatic hydrocarbon groups and aromatic hydrocarbon groups that contain from 1 to 18 carbon atoms and may be either substituted or unsubstituted.

Specifically, examples of the above substituted or unsubstituted aliphatic hydrocarbon groups include aliphatic hydrocarbon groups such as a methyl group, ethyl group, propyl group, isopropyl group, n-butyl group, sec-butyl group, tert-butyl group, pentyl group, hexyl group, octyl group, decyl group, dodecyl group, allyl group or vinyl group, as well as groups in which these groups have been substituted with an alkyl group, alkoxy group, aryl group, hydroxyl group, amino group or halogen atom or the like.

Furthermore, the above substituted or unsubstituted aliphatic hydrocarbon groups also include substituted or unsubstituted alicyclic hydrocarbon groups. Examples of substituted or unsubstituted alicyclic hydrocarbon groups include a cyclopentyl group, cyclohexyl group, cycloheptyl group, cyclopentenyl group or cyclohexenyl group, as well as groups in which these groups have been substituted with an alkyl group, alkoxy group, aryl group, aryloxy group, hydroxyl group, amino group or halogen atom or the like.

Examples of the above substituted or unsubstituted aromatic hydrocarbon groups include aryl groups such as a phenyl group or tolyl group, alkyl-substituted aryl groups such as a dimethylphenyl group, ethylphenyl group, butylphenyl group or tert-butylphenyl group, and alkoxy-substituted aryl groups such as a methoxyphenyl group, ethoxyphenyl group, butoxyphenyl group or tert-butoxyphenyl group, as well as groups that are further substituted with an alkyl group, alkoxy group, aryl group, aryloxy group, amino group or halogen atom or the like.

The expression "two or more R¹ groups may be bonded together to form a cyclic structure" used in relation to R¹ within the general formulas (I) and (Ia) describes those cases where two or three R¹ groups are bonded together, forming a combined bivalent or trivalent hydrocarbon group respectively. Examples of such groups, which can form a cyclic structure through bonds to the P atom, include alkylene groups such as an ethylene, propylene, butylene, pentylene or hexylene group, alkenyl groups such as an ethylenyl, propylenyl or butylenyl group, aralkylene groups such as a methylenephenylene group, arylene groups such as a phenylene, naphthylene or anthracenylene group, as well as groups in which these groups have been substituted with an alkyl group, alkoxy group, aryl group, aryloxy group, amino group, hydroxyl group or halogen atom or the like.

Although there are no particular restrictions on the R¹ groups of the above general formulas (I) and (Ia), monovalent substituent groups selected from the group consisting of alkyl groups and aryl groups are preferred. Of these, in terms of raw material availability, substituent groups selected from amongst unsubstituted aryl groups and alkyl group- and/or alkoxy group- and/or hydroxyl group-substituted aryl groups such as a phenyl group, p-tolyl group, m-tolyl group, o-tolyl group, p-methoxyphenyl group, m-methoxyphenyl group, o-methoxyphenyl group, p-hydroxyphenyl group, m-hydroxyphenyl group, o-hydroxyphenyl group, 2,5-dihydroxyphenyl group, 4-(4-hydroxyphenyl)phenyl group, 1-naphthyl group, 2-naphthyl group, 1-(2-hydroxynaphthyl) group or 1-(4-hydroxynaphthyl) group; and straight-chain or cyclic alkyl groups such as a methyl group, ethyl group, propyl group, isopropyl group, butyl group, sec-butyl group, tert-butyl group, octyl group or cyclohexyl group are even more preferred. Unsubstituted aryl groups and alkyl group- and/or alkoxy group- and/or hydroxyl group-substituted aryl groups such as a phenyl group, p-tolyl group, m-tolyl group, o-tolyl group, p-methoxyphenyl group, m-methoxyphenyl group, o-methoxyphenyl group, p-hydroxyphenyl group, m-hydroxyphenyl group, o-hydroxyphenyl group, 2,5-dihydroxyphenyl group, 4-(4-hydroxyphenyl)phenyl group, 1-naphthyl group, 2-naphthyl group, 1-(2-hydroxynaphthyl) group or 1-(4-hydroxynaphthyl) group are particularly desirable.

The expression "substituted or unsubstituted organic group of 1 to 18 carbon atoms" used in relation to R² within the above general formulas (I) and (Ia) and in relation to R³ within the general formulas (I) and (Ib) describes aliphatic hydrocarbon groups and aromatic hydrocarbon groups that contain from 1 to 18 carbon atoms and may be either substituted or unsubstituted, aliphatic hydrocarbon or aromatic hydrocarbon oxy groups, aliphatic hydrocarbon or aromatic hydrocarbon carbonyl groups, aliphatic hydrocarbon or aromatic hydrocarbon oxycarbonyl groups, and aliphatic hydrocarbon or aromatic hydrocarbon carbonyloxy groups.

Specifically, examples of the above substituted or unsubstituted aliphatic hydrocarbon groups and aromatic hydrocarbon groups are as described above.

Examples of the above aliphatic hydrocarbon oxy groups include groups with a structure in which an oxygen atom is bonded to an aforementioned aliphatic hydrocarbon group, such as a methoxy group, ethoxy group, propoxy group, isopropoxy group, n-butoxy group, sec-butoxy group, tert-butoxy group, cyclopropyloxy group, cyclohexyloxy group, cyclopentyloxy group, allyloxy group or vinyloxy group, as well as groups in which these groups have been substituted with an alkyl group, alkoxy group, aryl group, aryloxy group, amino group or halogen atom or the like. Examples of the above aromatic hydrocarbon oxy groups include groups with a structure in which an oxygen atom is bonded to an aforementioned aromatic hydrocarbon group, such as a phenoxy group, methylphenoxy group, ethylphenoxy group, methoxyphenoxy group, butoxyphenoxy group or phenoxyphenoxy group, as well as groups in which these groups have been substituted with an alkyl group, alkoxy group, aryl group, aryloxy group, amino group or halogen atom or the like.

Examples of the above carbonyl groups include aliphatic hydrocarbon carbonyl groups such as a formyl group, acetyl group, ethylcarbonyl group, butyryl group, cyclohexylcarbonyl group or allylcarbonyl group, aromatic hydrocarbon carbonyl groups such as a phenylcarbonyl group or methylphenylcarbonyl group, as well as groups in which these groups have been substituted with an alkyl group, alkoxy group, aryl group, aryloxy group, amino group or halogen atom or the like.

Examples of the above oxycarbonyl groups include aliphatic hydrocarbon oxycarbonyl groups such as a methoxycarbonyl group, ethoxycarbonyl group, butoxycarbonyl group, allyloxycarbonyl group or cyclohexyloxycarbonyl group, aromatic hydrocarbon oxycarbonyl groups such as a phenoxycarbonyl group or methylphenoxycarbonyl group, as well as groups in which these groups have been substituted with an alkyl group, alkoxy group, aryl group, aryloxy group, amino group or halogen atom or the like.

Examples of the above carbonyloxy groups include aliphatic hydrocarbon carbonyloxy groups such as a methylcarbonyloxy group, ethylcarbonyloxy group, butylcarbonyloxy group, allylcarbonyloxy group or cyclohexylcarbonyloxy group, aromatic hydrocarbon carbonyloxy groups such as a phenylcarbonyloxy group or methylphenylcarbonyloxy group, as well as groups in which these groups have been substituted with an alkyl group, alkoxy group, aryl group, aryloxy group, amino group or halogen atom or the like.

The expression "two or more $R^2$ groups may be bonded together to form a cyclic structure" used in relation to $R^2$ within the above general formulas (I) and (Ia) describes those cases where two to four $R^2$ groups are bonded together, forming a combined bivalent through tetravalent organic group respectively. Examples of groups that can form a cyclic structure include alkylene groups such as an ethylene, propylene, butylene, pentylene or hexylene group; alkenyl groups such as an ethylenyl, propylenyl or butylenyl group; aralkylene groups such as a methylenephenylene group; arylene groups such as a phenylene, naphthylene or anthracenylene group; as well as oxy groups and dioxy groups of these alkylene groups, alkenyl groups, aralkylene groups and arylene groups, and the above groups may also be substituted with an alkyl group, alkoxy group, aryl group, aryloxy group, amino group, hydroxyl group or halogen atom or the like.

The expression "two or more $R^3$ groups may be bonded together to form a cyclic structure" used in relation to $R^3$ within the general formulas (I) and (Ib) describes those cases where two or three $R^3$ groups are bonded together, forming a combined bivalent or trivalent organic group respectively. Examples of such groups, which can form a cyclic structure through bonds to the Si atom, include alkylene groups such as an ethylene, propylene, butylene, pentylene or hexylene group; alkenyl groups such as an ethylenyl, propylenyl or butylenyl group; aralkylene groups such as a methylenephenylene group; arylene groups such as a phenylene, naphthylene or anthracenylene group; as well as oxy groups and dioxy groups of these alkylene groups, alkenyl groups, aralkylene groups and arylene groups, and the above groups may also be substituted with an alkyl group, alkoxy group, aryl group, aryloxy group, amino group, hydroxyl group or halogen atom or the like.

Although there are no particular restrictions on the $R^2$ groups of the above general formulas (I) and (Ia), a hydrogen atom, hydroxyl group, alkyl groups, aryl groups, alkoxy groups and aryloxy groups are preferred. Of these, in terms of raw material availability, substituent groups selected from amongst a hydrogen atom; hydroxyl group; alkoxy groups such as a methoxy group, ethoxy group, propoxy group, isopropoxy group, butoxy group, sec-butoxy group or tert-butoxy group; aryloxy groups such as a phenoxy group, p-tolyloxy group, m-tolyloxy group or o-tolyloxy group; unsubstituted aryl groups or alkyl group- and/or alkoxy group- and/or hydroxyl group-substituted aryl groups such as a phenyl group, p-tolyl group, m-tolyl group, o-tolyl group or p-methoxyphenyl group; and straight-chain or cyclic alkyl groups such as a methyl group, ethyl group, propyl group, isopropyl group, butyl group, sec-butyl group, tert-butyl group, octyl group or cyclohexyl group are even more preferred. Substituent groups selected from amongst a hydrogen atom; hydroxyl group; unsubstituted aryl groups or alkyl group- and/or alkoxy group- and/or hydroxyl group-substituted aryl groups such as a phenyl group, p-tolyl group, m-tolyl group, o-tolyl group or p-methoxyphenyl group; and straight-chain or cyclic alkyl groups such as a methyl group, ethyl group, propyl group, isopropyl group, butyl group, sec-butyl group, tert-butyl group, octyl group or cyclohexyl group are particularly desirable. In those cases where two or more $R^2$ groups are bonded together to form a cyclic structure, although there are no particular restrictions, organic groups that form a polycyclic aromatic group such as a 1-(2-hydroxynaphthyl) group or 1-(4-hydroxynaphthyl) group in combination with the benzene ring to which the $R^2$ groups are bonded are preferred.

Although there are no particular restrictions on the $R^3$ groups of the above general formulas (I) and (Ib), a hydrogen atom, alkyl groups, aryl groups, alkoxy groups and aryloxy groups are preferred. Of these, in terms of raw material availability, substituent groups selected from amongst a hydrogen atom; alkoxy groups such as a methoxy group, ethoxy group, propoxy group, isopropoxy group, butoxy group, sec-butoxy group or tert-butoxy group; aryloxy groups such as a phenoxy group, p-tolyloxy group, m-tolyloxy group or o-tolyloxy group; unsubstituted aryl groups or alkyl group- and/or alkoxy group- and/or hydroxyl group-substituted aryl groups such as a phenyl group, p-tolyl group, m-tolyl group, o-tolyl group or p-methoxyphenyl group; and straight-chain or cyclic alkyl groups such as a methyl group, ethyl group, propyl group, isopropyl group, butyl group, sec-butyl group, tert-butyl group, octyl group or cyclohexyl group are even more preferred. Substituent groups selected from amongst a hydrogen atom; unsubstituted aryl groups or alkyl group- and/or alkoxy group- and/or hydroxyl group-substituted aryl groups such as a phenyl group, p-tolyl group, m-tolyl group, o-tolyl group or p-methoxyphenyl group; and straight-chain or cyclic alkyl groups such as a methyl group, ethyl group, propyl group, isopropyl group, butyl group, sec-butyl group, tert-butyl group, octyl group or cyclohexyl group are particularly desirable.

In the above general formulas (I) and (Ib), m represents an integer from 1 to 4, but in terms of raw material availability, preferably represents 1 or 2. In the general formula (I), p represents a number of 0 or greater, which is determined on the basis of the starting raw materials and the production method, and the value of p is not restricted in any way in terms of the function and effects of the present invention.

In the above general formula (I), YH represents an organic group of 0 to 18 carbon atoms containing one or more releasable protons ($H^+$), and may be bonded to one or more $R^1$ groups to form a cyclic structure. Examples of YH include groups in which a hydrogen atom is bonded to a group 16 atom, such as a hydroxyl group, mercapto group or hydroseleno group; groups of 1 to 18 carbon atoms containing a carboxyl group, such as a carboxyl group, carboxymethyl group, carboxyethyl group, carboxyphenyl group or carboxynaphthyl group; and monovalent organic groups of 1 to 18 carbon atoms containing a phenolic hydroxyl group, such as a hydroxyphenyl group, hydroxyphenylmethyl group, hydroxynaphthyl group, hydroxyfuryl group, hydroxythienyl group or hydroxypyridyl group.

Furthermore, in those cases where the YH group in the formula (I) is bonded to one or more $R^2$ groups to form a cyclic structure, examples of the YH group include bivalent organic groups that form a hydroxy-substituted polycyclic aromatic group such as a 2-(6-hydroxynaphthyl) group in combination with the benzene ring to which YH is bonded.

Of the various YH groups described above, although there are no particular restrictions, a hydroxyl group in which an oxygen atom and hydrogen atom are bonded together, or a monovalent organic group containing a phenolic hydroxyl group, such as a hydroxyphenyl group, hydroxyphenylmethyl group, hydroxynaphthyl group, hydroxyfuryl group, hydroxythienyl group or hydroxypyridyl group is preferred.

Although there are no particular restrictions on preferred embodiments for the compound represented by the formula (I), in terms of raw material availability, at least one of the $R^1$ groups is preferably a substituted or unsubstituted aromatic hydrocarbon group, compounds in which all of the $R^1$ groups are substituted or unsubstituted aromatic hydrocarbon groups are even more preferred, and compounds in which all the $R^1$ groups are phenyl groups are the most desirable, and in addition, at least one of, and preferably all of, the $R^2$ groups are preferably hydrogen atoms, at least one of the $R^3$ groups is preferably a substituted or unsubstituted aromatic hydrocarbon group, and YH is preferably a monovalent organic group containing a hydroxyl group or a phenolic hydroxyl group.

In the above general formula (Ia), $Y^-$ is an organic group formed by eliminating one proton from an organic group of 0 to 18 carbon atoms containing one or more releasable protons ($H^+$), and may be bonded to one or more $R^2$ groups to form a cyclic structure. Examples of $Y^-$ include groups in which a proton has been eliminated from a monovalent organic group in which the hydrogen atom is bonded to a group 16 atom, such as a hydroxyl group, mercapto group or hydroseleno group; groups in which the carboxylic acid proton has been eliminated from a monovalent organic group of 1 to 18 carbon atoms containing a carboxyl group, such as a carboxyl group, carboxymethyl group, carboxyethyl group, carboxyphenyl group or carboxynaphthyl group; and groups in which the phenolic proton has been eliminated from a monovalent organic group of 1 to 18 carbon atoms containing a phenolic hydroxyl group, such as a hydroxyphenyl group, hydroxyphenylmethyl group, hydroxynaphthyl group, hydroxyfuryl group, hydroxythienyl group or hydroxypyridyl group.

Furthermore, in those cases where the $Y^-$ group in the formula (Ia) is bonded to one or more $R^2$ groups to form a cyclic structure, examples of the $Y^-$ group include bivalent organic groups which, in combination with the benzene ring to which the $Y^-$ group is bonded, form a group in which a proton has been eliminated from the hydroxyl group of a hydroxy polycyclic aromatic group such as a 2-(6-hydroxynaphthyl) group.

Of the various $Y^-$ groups described above, although there are no particular restrictions, an oxygen anion formed by eliminating a proton from a hydroxyl group, and groups containing an oxygen anion produced by eliminating a proton from the phenolic hydroxyl group of a group such as a hydroxyphenyl group, hydroxyphenylmethyl group, hydroxynaphthyl group, hydroxyfuryl group, hydroxythienyl group or hydroxypyridyl group are preferred.

There are no particular restrictions on the method used for producing the compound represented by the above general formula (I) that constitutes a curing accelerator according to the present invention, and any method that enables production of the targeted compound is suitable. For example, the compound can be prepared by reacting an intramolecular phosphonium salt represented by the above general formula (Ia) and a silanol compound represented by the above general formula (Ib) within a solvent. There are no particular restrictions on the solvent used, provided the solvent allows the reaction to proceed.

[Curable Resin Composition]

A curable resin composition that represents another aspect of the present invention comprises a curing accelerator (A) and a curable resin (B), wherein the curing accelerator (A) comprises one or more of the curing accelerators according to the present invention described above. A curable resin composition according to the present invention may further comprise, in addition to the above components (A) and (B), a curing agent (C) and an inorganic filler (D). Furthermore, if necessary, various additives such as coupling agents, ion exchangers, release agents, stress releasers, flame retardants and colorants may also be added. As follows is a description of the main components that constitute a curable resin composition according to the present invention.

(A) Curing Accelerator

In a curable resin composition according to the present invention, the curing accelerator must use one or more curing accelerators according to the present invention, but one or more conventional curing accelerators may also be used in combination therewith. There are no particular restrictions on the blend quantity of the curing accelerator (A) within the composition, provided the desired curing acceleration effect can be achieved. However, from the viewpoint of improving the curability and fluidity of the resin composition upon moisture absorption, the total quantity of the curing accelerator (A) is preferably within a range from 0.1 to 10 parts by weight, and even more preferably from 1 to 7.0 parts by weight, per 100 parts by weight of the total weight of the curable resin (B). If this blend quantity is less than 0.1 parts by weight, then achieving curing within a short time period is difficult, whereas if the quantity exceeds 10 parts by weight, then the curing rate becomes overly fast, which may make obtaining a favorable molded product impossible.

Examples of conventional curing accelerators that can be used in combination with the curing accelerator according to the present invention include cycloamidine compounds including diazabicycloalkenes such as 1,5-diazabicyclo[4.3.0]nonene-5 and 1,8-diazabicyclo[5.4.0]undecene-7, as well as derivatives thereof; compounds having intramolecular polarization, such as phenol novolac salts of the above cycloamidine compounds, and compounds produced by adding a compound with a π-bond, such as maleic anhydride or a quinone compound such as 1,4-benzoquinone, 2,5-toluquinone, 1,4-naphthoquinone, 2,3-dimethylbenzoquinone, 2,6-dimethylbenzoquinone, 2,3-dimethoxy-5-methyl-1,4-benzoquinone, 2,3-dimethoxy-1,4-benzoquinone or phenyl-1,4-benzoquinone, to the above cycloamidine compounds; tertiary amines such as triethylenediamine, benzyldimethylamine, triethanolamine, dimethylaminoethanol and tris(dimethylaminomethyl)phenol, and derivatives thereof; imidazoles such as 2-methylimidazole, 2-phenylimidazole, 2-phenyl-4-methylimidazole and 2-heptadecylimidazole; tetra-substituted phosphonium tetra-substituted borates such as tetraphenylphosphonium tetraphenylborate; tetraphenylboron salts such as 2-ethyl-4-methylimidazole tetraphenylborate and N-methylmorpholine tetraphenylborate; organophosphines such as triphenylphosphine, diphenyl(p-tolyl)phosphine, tris(alkylphenyl)phosphines, tris(alkoxyphenyl)phosphines, tris(alkyl-alkoxyphenyl)phosphines, tris(dialkylphenyl)phosphines, tris(trialkylphenyl)phosphines, tris(tetraalkylphenyl)phosphines, tris(dialkoxyphenyl)phosphines, tris(trialkoxyphenyl)phosphines, tris(tetraalkoxyphenyl)phosphines, trialkylphosphines, dialkylarylphosphines and alkyldiarylphosphines; complexes of the above organophosphines and organoboron compounds; compounds having intramolecular polarization produced by adding a compound with a π-bond, such as maleic anhydride or a quinone compound such as 1,4-benzoquinone, 2,5-toluquinone, 1,4-naphthoquinone, 2,3-dimethylbenzoquinone, 2,6-dimethylbenzoquinone, 2,3-dimethoxy-5-methyl-1,4-benzoquinone, 2,3-dimethoxy-1,4-benzoquinone or phenyl-1,4-benzoquinone, to the above organophosphine compounds; and compounds having intramolecular polarization produced by first reacting one of the above organophosphines with a halogenated phenol compound such as 4-bromophenol, 3-bromophenol, 2-bromophenol, 4-chlorophenol, 3-chlorophenol, 2-chlorophenol, 4-iodophenol, 3-iodophenol, 2-iodophenol, 4-bromo-2-methylphenol, 4-bromo-3-methylphenol, 4-bromo-2,6-dimethylphenol, 4-bromo-3,5-dimethylphenol, 4-bromo-2,6-di-tert-butylphenol, 4-chloro-1-naphthol, 1-bromo-2-naphthol, 6-bromo-2-naphthol or 4-bromo-4'-hydroxybiphenyl, and subsequently conducting a dehydrohalogenation step (as disclosed in Japanese Patent Laid-Open No. 2004-156036). If these curing accelerators are used in combination, then of the above possibilities, from the viewpoint of fluidity, compounds having intramolecular polarization produced by adding an organophosphine and a compound with a π-bond, and compounds having intramolecular polarization produced by first reacting an organophosphine with a halogenated phenol compound and subsequently conducting a dehydrohalogenation are preferred, whereas from the viewpoint of curability, compounds having intramolecular polarization produced by first reacting an organophosphine with a halogenated phenol compound and subsequently conducting a dehydrohalogenation are preferred.

In those cases where the curing accelerator (A) also includes an aforementioned conventional curing accelerator, the combined quantity of the one or more curing accelerators according to the present invention relative to the total quantity of the curing accelerator (A) is preferably at least 30% by weight, and even more preferably 50% by weight or greater. If the quantity of the curing accelerator according to the present invention is less than 30% by weight, then the curability and/or fluidity upon moisture absorption tends to deteriorate, causing a deterioration in the effects achievable by the present invention.

(B) Curable Resin

There are no particular restrictions on the curable resins (B) that can be used in the present invention, provided the curing of the resin can be accelerated by the curing accelerator (A) according to the present invention. Examples of suitable resins include epoxy resins, phenolic resins, silicon-based resins, amino resins, unsaturated polyester resins, diallyl phthalate resins and alkyd resins, and these resins may be used either alone, or in combinations of two or more different resins. Of the above resins, from the viewpoint of ensuring a satisfactory manifestation of the curing acceleration effect of the curing accelerator (A) according to the present invention, the curable resin (B) preferably comprises an epoxy resin.

In those cases where an epoxy resin is used as a component of the curable resin (B), epoxy resins containing two or more epoxy groups within each molecule can be used. There are no particular restrictions on such epoxy resins, and suitable examples include novolac epoxy resins such as phenol novolac epoxy resins and orthocresol novolac epoxy resins, which are prepared by epoxidation of a novolac resin obtained by condensing or co-condensing a phenol such as phenol, cresol, xylenol, resorcinol, catechol, bisphenol A or bisphenol F, and/or a naphthol such as α-naphthol, β-naphthol or dihydroxynaphthalene, with a compound containing an aldehyde group, such as formaldehyde, acetaldehyde, propionaldehyde, benzaldehyde or salicylaldehyde, in the presence of an acid catalyst;

diglycidyl ethers of bisphenol A, bisphenol F, bisphenol S, alkyl-substituted or unsubstituted biphenols, or stilbene-based phenols (namely, bisphenol epoxy resins, biphenyl epoxy resins, and stilbene epoxy resins);

glycidyl ethers of alcohols such as butanediol, polyethylene glycol and polypropylene glycol;

glycidyl ester epoxy resins of carboxylic acids such as phthalic acid, isophthalic acid and tetrahydrophthalic acid;

glycidyl or methylglycidyl epoxy resins such as compounds obtained by substituting the active hydrogen bonded to a nitrogen atom within aniline or isocyanuric acid or the like with a glycidyl group;

alicyclic epoxy resins obtained by epoxidizing an intramolecular olefinic bond, such as vinylcyclohexene diepoxide, 3,4-epoxycyclohexylmethyl-3,4-epoxycyclohexanecarboxylate, and 2-(3,4-epoxy)cyclohexyl-5,5-spiro(3,4-epoxy)cyclohexane-m-dioxane;

glycidyl ethers of para-xylylene- and/or meta-xylylene-modified phenolic resins;

glycidyl ethers of terpene-modified phenolic resins;

glycidyl ethers of dicyclopentadiene-modified phenolic resins;

glycidyl ethers of cyclopentadiene-modified phenolic resins;

glycidyl ethers of polycyclic aromatic ring-modified phenolic resins;

glycidyl ethers of naphthalene ring-containing phenolic resins;

halogenated phenol novolac epoxy resins;

hydroquinone epoxy resins;

trimethylolpropane epoxy resins;

linear aliphatic epoxy resins obtained by the oxidation of an olefinic bond with a peracid such as peracetic acid;

diphenylmethane epoxy resins;

epoxidized products of aralkyl phenolic resins such as phenol aralkyl resins and naphthol aralkyl resins; and sulfur atom-containing epoxy resins, and any of these resins may be used either alone, or in combinations of two or more different resins.

Of the above epoxy resins, from the viewpoints of achieving favorable reflow crack resistance and fluidity, biphenyl epoxy resins, stilbene epoxy resins, diphenylmethane epoxy resins, sulfur atom-containing epoxy resins, novolac epoxy resins, dicyclopentadiene epoxy resins, salicylaldehyde epoxy resins, napthol-phenol copolymer epoxy resins, and epoxidized products of aralkyl phenolic resins such as phenol aralkyl resins and naphthol aralkyl resins are preferred, and these resins may be used either alone, or in combinations of two or more different resins. In order to ensure satisfactory manifestation of the performance of these preferred resins, the total quantity of these preferred resins, relative to the total quantity of epoxy resins, is preferably at least 30% by weight, and is even more preferably 50% by weight or greater. Specific examples of preferred epoxy resins are described below.

There are no particular restrictions on the biphenyl epoxy resins, provided they are epoxy resins with a biphenyl backbone, but epoxy resins represented by a general formula (II) shown below are preferred. Of the epoxy resins represented by the general formula (II) shown below, if the positions that are substituted with oxygen atoms are labeled positions 4 and 4', then resins such as the resin in which the $R^8$ groups at positions 3, 3', 5 and 5' are methyl groups and the remaining $R^8$ groups are hydrogen atoms (product name: YX-4000H, manufactured by Japan Epoxy Resins Co., Ltd.), the resin in which all of the $R^8$ groups are hydrogen atoms, namely 4,4'-bis(2,3-epoxypropoxy)biphenyl, and a mixture of the resin in which all of the $R^8$ groups are hydrogen atoms, and the resin in which, if the positions that are substituted with oxygen atoms are labeled positions 4 and 4', the $R^8$ groups at positions 3, 3', 5 and 5' are methyl groups and the remaining $R^8$ groups are hydrogen atoms (product name: YL-6121H, manufactured by Japan Epoxy Resins Co., Ltd.) are available as commercial products.

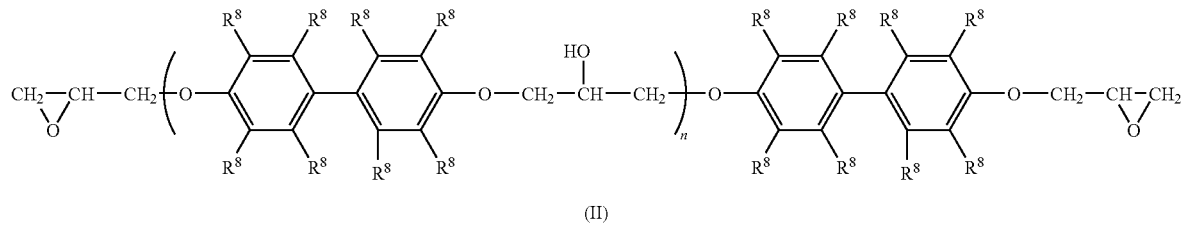

(II)

(In the formula (II), $R^8$ represents a hydrogen atom, an alkyl group of 1 to 12 carbon atoms, or an aryl group of 4 to 18 carbon atoms, the $R^8$ groups may be either all the same or different, and n is an average value that represents a positive number from 0 to 10.)

There are no particular restrictions on the stilbene epoxy resins, provided they are epoxy resins with a stilbene backbone, but epoxy resins represented by a general formula (III) shown below are preferred.

Of the epoxy resins represented by the general formula (III) shown below, if the positions that are substituted with oxygen atoms are labeled positions 4 and 4', then resins such as a mixture of the resin in which the $R^9$ groups at positions 3, 3', 5 and 5' are methyl groups, the remaining $R^9$ groups are hydrogen atoms, and the $R^{10}$ groups are all hydrogen atoms, and a resin in which three of the $R^9$ groups at positions 3, 3', 5 and 5' are methyl groups and one group is a tert-butyl group, the remaining $R^9$ groups are hydrogen atoms, and the $R^{10}$ groups are all hydrogen atoms (product name: ESLV-210, manufactured by Sumitomo Chemical Co., Ltd.) are available as commercial products.

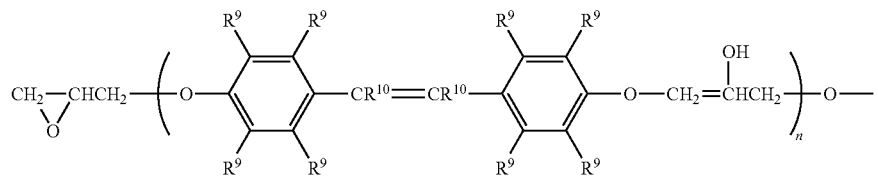

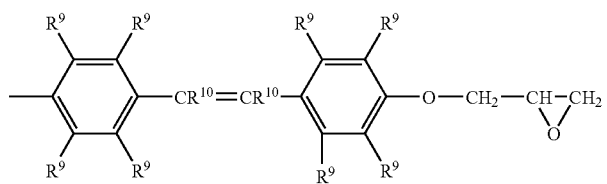

(III)

(In the formula (III), $R^9$ and $R^{10}$ represent hydrogen atoms or monovalent organic groups of 1 to 18 carbon atoms, wherein these groups may be either all the same or different, and n is an average value that represents a positive number from 0 to 10.)

There are no particular restrictions on the diphenylmethane epoxy resins, provided they are epoxy resins with a diphenylmethane backbone, but epoxy resins represented by a general formula (IV) shown below are preferred. Of the epoxy resins represented by the general formula (IV) shown below, resins such as a resin in which all the $R^1$ groups are hydrogen atoms, and in which, if the positions that are substituted with oxygen atoms are labeled positions 4 and 4', the $R^{12}$ groups at positions 3, 3', 5 and 5' are methyl groups and the remaining $R^{12}$ groups are hydrogen atoms (product name: YSLV-80XY, manufactured by Nippon Steel Chemical Group) are available as commercial products.

[Formula 9]

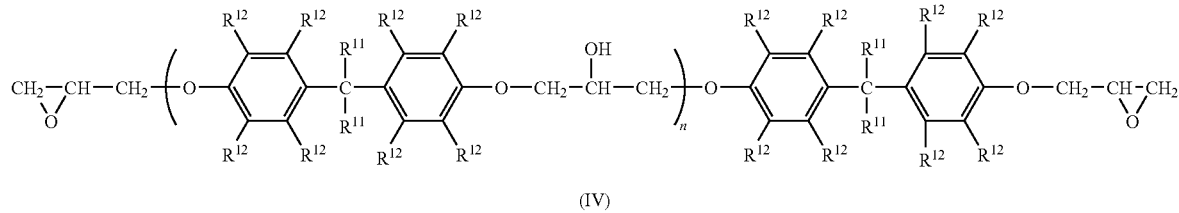

(IV)

(In the formula (IV), $R^{11}$ and $R^{12}$ represent hydrogen atoms or monovalent organic groups of 1 to 18 carbon atoms, wherein these groups may be either all the same or different, and n is an average value that represents a positive number from 0 to 10.)

There are no particular restrictions on the sulfur atom-containing epoxy resins, provided they are epoxy resins that contain a sulfur atom, and suitable examples include the epoxy resins represented by a general formula (V) shown below. Of the epoxy resins represented by the general formula (V) shown below, if the positions that are substituted with oxygen atoms are labeled positions 4 and 4', then resins such as the resin in which the $R^{13}$ groups at positions 3 and 3' are tert-butyl groups, the $R^{13}$ groups at positions 6 and 6' are methyl groups, and the remaining $R^{13}$ groups are hydrogen atoms (product name: YSLV-120TE, manufactured by Nippon Steel Chemical Group) are available as commercial products.

[Formula 10]

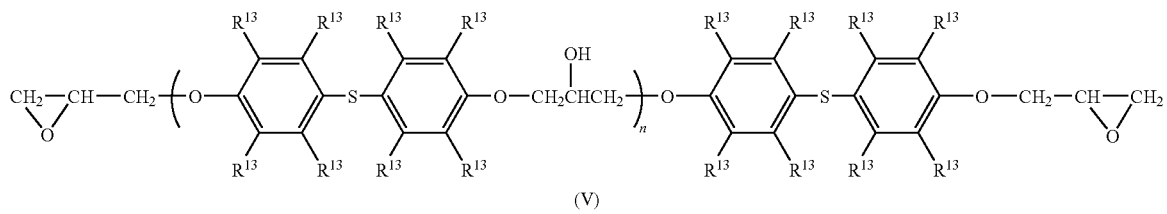

(V)

(In the formula (V), $R^{13}$ represents a hydrogen atom or a monovalent organic group of 1 to 18 carbon atoms, wherein these groups may be either all the same or different, and n is an average value that represents a positive number from 0 to 10.)

There are no particular restrictions on the novolac epoxy resins, provided they are epoxy resins obtained by epoxidizing a novolac phenolic resin, but epoxy resins obtained by epoxidation of a novolac phenolic resin such as phenol novolac, cresol novolac or naphthol novolac using a glycidyl etherification technique are preferred, and for example, epoxy resins represented by a general formula (VI) shown below are particularly preferred. Of the epoxy resins represented by the general formula (VI) shown below, resins such as those in which all of the $R^{14}$ groups are hydrogen atoms, $R^{15}$ is a methyl group and i=1 (product names: ESCN-190 and ESCN-195, manufactured by Sumitomo Chemical Co., Ltd.) are available as commercial products.

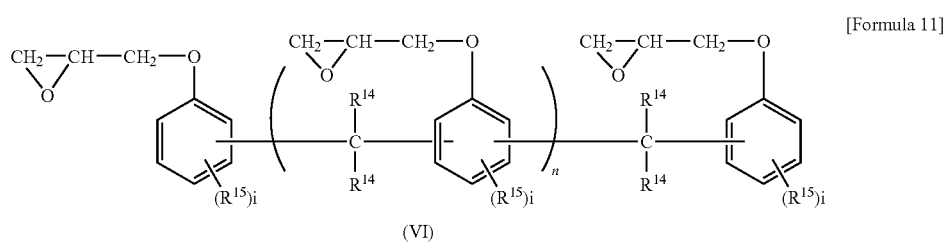

[Formula 11]

(In the formula (VI), $R^{14}$ and $R^{15}$ represent hydrogen atoms or monovalent organic groups of 1 to 18 carbon atoms, wherein these groups may be either all the same or different, i represents an integer from 0 to 3, and n is an average value that represents a positive number from 0 to 10.)

There are no particular restrictions on the dicyclopentadiene epoxy resins, provided they are epoxy resins obtained by epoxidizing a raw material compound with a dicyclopentadiene backbone, but epoxy resins represented by a general formula (VII) shown below are preferred. Of the epoxy resins represented by the general formula (VII) shown below, resins such as the resin in which i=0 (product name: HP-7200, manufactured by Dainippon Ink and Chemicals, Incorporated) are available as commercial products.

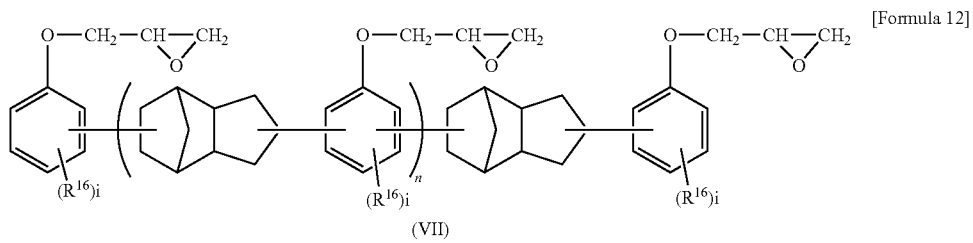

[Formula 12]

(In the formula (VII), $R^{16}$ represents a hydrogen atom or a monovalent organic group of 1 to 18 carbon atoms, wherein these groups may be either all the same or different, i represents an integer from 0 to 3, and n is an average value that represents a positive number from 0 to 10.)

There are no particular restrictions on the salicylaldehyde epoxy resins, provided they are epoxy resins obtained using a compound with a salicylaldehyde backbone as the raw material, but salicylaldehyde epoxy resins such as those obtained by glycidyl etherification of a salicylaldehyde phenolic resin, such as the novolac phenolic resin of a compound with a salicylaldehyde backbone and a compound containing a phenolic hydroxyl group, are preferred, and epoxy resins represented by a general formula (VIII) shown below are particularly preferred. Of the epoxy resins represented by the general formula (VIII) shown below, resins such as the resin in which i=0 and k=0 (product name: 1032H60, manufactured by Japan Epoxy Resins Co., Ltd., and product name: EPPN-502H, manufactured by Nippon Kayaku Co., Ltd.) are available as commercial products.

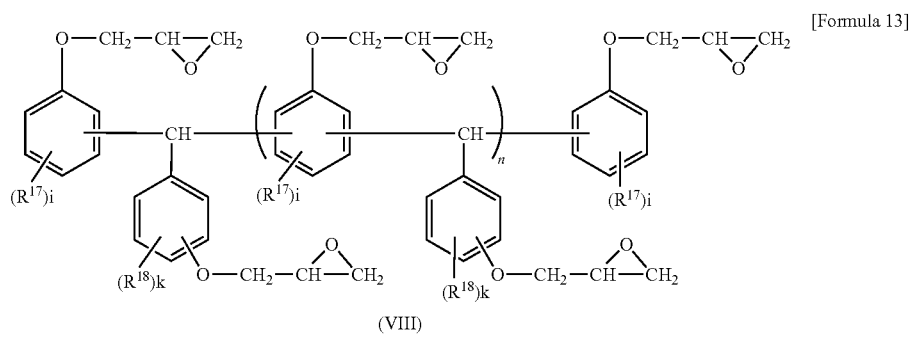

[Formula 13]

(In the formula (VIII), $R^{17}$ and $R^{18}$ represent hydrogen atoms or monovalent organic groups of 1 to 18 carbon atoms, wherein these groups may be either all the same or different, i represents an integer from 0 to 3, k represents an integer from 0 to 4, and n is an average value that represents a positive number from 0 to 10.)

There are no particular restrictions on the napthol-phenol copolymer epoxy resins, provided they are epoxy resins obtained using a compound with a naphthol backbone and a compound with a phenol backbone as raw materials, but resins obtained by glycidyl etherification of a novolac phenolic resin prepared using a compound with a naphthol backbone and a compound with a phenol backbone are preferred, and epoxy resins represented by a general formula (IX) shown below are particularly preferred. Of the epoxy resins represented by the general formula (IX) shown below, resins such as the resin in which $R^{21}$ is a methyl group, i=1, j=0 and k=0 (product name: NC-7300, manufactured by Nippon Kayaku Co., Ltd.) are available as commercial products.

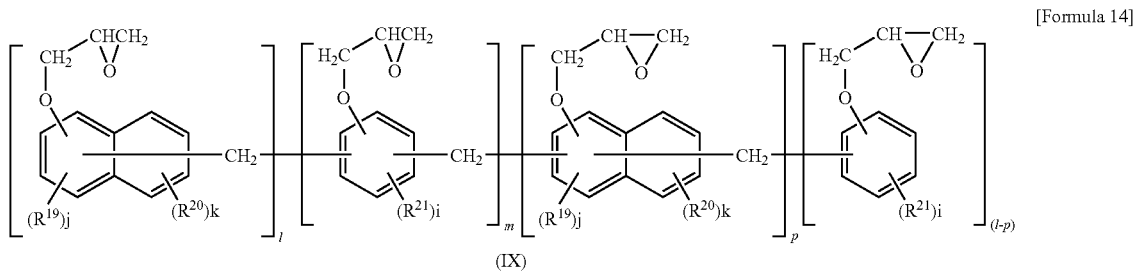

[Formula 14]

(In the formula (IX), $R^{19}$ to $R^{21}$ represent hydrogen atoms or monovalent organic groups of 1 to 18 carbon atoms, wherein these groups may be either all the same or different, i represents an integer from 0 to 3, j represents an integer from 0 to 2, k represents an integer from 0 to 4, p is an average value that represents a positive number from 0 to 1, and l and m are both average values that each represent a positive number from 0 to 11, provided that (l+m) represents a positive number from 1 to 11.)

Examples of epoxy resins represented by the above general formula (IX) include copolymers comprising 1 structural units and m structural units, including random copolymers where these structural units are arranged randomly, alternating copolymers where the structural units are arranged alternately, copolymers where the structural units are arranged regularly, and block copolymers where the structural units are arranged in blocks, and these copolymers may be used either alone, or in combinations of two or more different copolymers.

There are no particular restrictions on the epoxidized products of aralkyl phenolic resins such as phenol aralkyl resins and naphthol aralkyl resins, provided they are epoxy resins obtained using raw material phenolic resins synthesized from a phenol such as phenol or cresol and/or a naphthol such as naphthol or dimethylnaphthol, and dimethoxyparaxylene or bis(methoxymethyl)biphenyl or derivatives thereof. For example, resins obtained by glycidyl etherification of a phenolic resin synthesized from a phenol such as phenol or cresol and/or a naphthol such as naphthol or dimethylnaphthol, and dimethoxyparaxylene or bis(methoxymethyl)biphenyl or derivatives thereof are preferred, and epoxy resins represented by general formulas (X) and (XI) shown below are particularly preferred. Of the epoxy resins represented by the general formula (X) shown below, resins such as the resin in which i=0 and $R^{40}$ is a hydrogen atom (product name: NC-3000S, manufactured by Nippon Kayaku Co., Ltd.), and a resin mixture in which the epoxy resin in which i=0 and $R^{40}$ is a hydrogen atom, and the epoxy resin of the general formula (II) in which all the $R^8$ groups are hydrogen atoms are mixed together in a weight ratio of 80:20 (product name: CER-3000, manufactured by Nippon Kayaku Co., Ltd.) are available as commercial products. Furthermore, of the epoxy resins represented by the general formula (XI) shown below, resins such as the resin in which i=0, j=0 and k=0 (product name: ESN-175, manufactured by Nippon Steel Chemical Group) are available as commercial products.

[Formula 15]

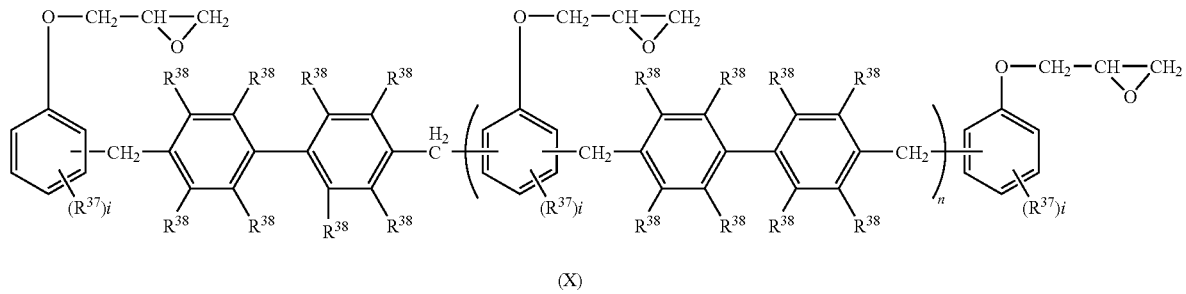

(X)

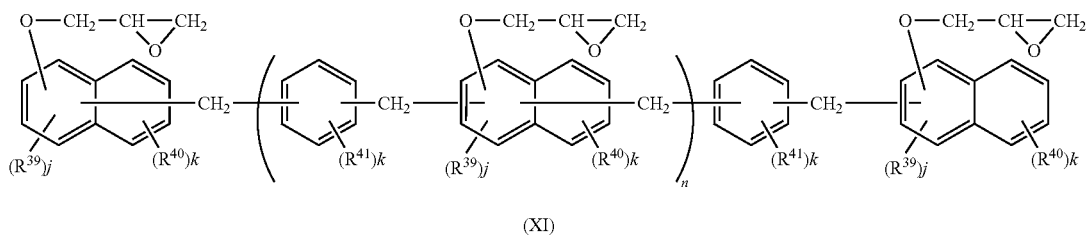

(XI)

(In the formulas (X) and (XI), $R^{37}$ to $R^{41}$ represent hydrogen atoms or monovalent organic groups of 1 to 18 carbon atoms, wherein these groups may be either all the same or different, i represents an integer from 0 to 3, j represents an integer from 0 to 2, and k represents an integer from 0 to 4.)

In the above general formulas (II) through (XI), the expression "these groups may be either all the same or different" used in relation to the groups $R^8$ through $R^{21}$ and $R^{37}$ through $R^{41}$ means that, for example, the 8 to 88 $R^8$ groups within the formula (II) may be either all the same or different. Similarly, for each of the groups $R^9$ to $R^{21}$ and $R^{37}$ to $R^{41}$, the total number of all the groups of that type within a formula may be either all the same or different. Furthermore, the groups $R^8$ through $R^{21}$ and $R^{37}$ through $R^{41}$ may be the same as one another or different. For example, all of the $R^9$ groups and $R^{10}$ groups may be the same, or they may be different.

The value of n within the above general formulas (II) through (XI) must fall within a range from 0 to 10, and if the value exceeds 10, the melt viscosity of the component (B) increases, which causes an increase in the viscosity of the curable resin composition during melt molding, and increases the likelihood of incomplete filling faults, and deformation of the bonding wires (the metal lines used to connect elements and leads). The average value of n within each molecule is preferably set within a range from 0 to 4.

Specific examples of preferred epoxy resins that can be used within a curable resin composition according to the present invention were described above with reference to the above general formulas (II) through (XI), but in terms of the reflow crack resistance, a specific examples of a particularly preferred epoxy resin is 4,4'-bis(2,3-epoxypropoxy)-3,3',5,5'-tetramethylbiphenyl, whereas in terms of the moldability and heat resistance, a particularly preferred epoxy resin is 4,4'-bis(2,3-epoxypropoxy)-biphenyl.

(C) Curing Agent

A curing agent (C) may also be used in a curable resin composition of the present invention according to need. In those cases where an epoxy resin is used as the curable resin (B), there are no particular restrictions on the curing agents that can be used, provided the curing agent is a compound capable of curing the epoxy resin. Examples of suitable curing agents include phenol compounds such as phenolic resins, amine compounds such as diamines and polyamines, organic acid anhydrides such as phthalic anhydride, trimellitic anhydride and pyromellitic anhydride, and carboxylic acid compounds such as dicarboxylic acids and polycarboxylic acids. These compounds may be used either alone, or in combinations of two or more different compounds. Of these, from the viewpoint of ensuring satisfactory manifestation of the effects of the curing accelerator (A), phenolic resins are preferred.

There are no particular restrictions on the phenolic resins that can be used as the curing agent (C). For example, the types of phenolic resins containing two or more phenolic hydroxyl groups within each molecule that are typically used as curing agents are suitable, and specific examples include compounds containing two phenolic hydroxyl groups within each molecule, such as resorcinol, catechol, bisphenol A, bisphenol F, and substituted or unsubstituted biphenols;

novolac phenolic resins obtained by condensing or co-condensing a phenol such as phenol, cresol, xylenol, resorcinol, catechol, bisphenol A, bisphenol F, phenylphenol or aminophenol, and/or a naphthol such as α-naphthol, β-naphthol or dihydroxynaphthalene, with an aldehyde such as formaldehyde, acetaldehyde, propionaldehyde, benzaldehyde or salicylaldehyde, in the presence of an acid catalyst;

aralkyl phenolic resins such as phenol aralkyl resins and naphthol aralkyl resins synthesized from a phenol and/or a naphthol, and dimethoxyparaxylene or bis(methoxymethyl)biphenyl;

para-xylylene- and/or meta-xylylene-modified phenolic resins;

melamine-modified phenolic resins;

terpene-modified phenolic resins;

dicyclopentadiene phenolic resins and dicyclopentadiene naphthol resins synthesized by copolymerization of a phenol and/or a naphthol, and dicyclopentadiene;

cyclopentadiene-modified phenolic resins;

polycyclic aromatic ring-modified phenolic resins;

biphenyl phenolic resins;

triphenylmethane phenolic resins; and phenolic resins obtained by copolymerization of two or more of the above resins, and these resins may be used either alone, or in combinations of two or more different resins.

Of the above phenolic resins, from the viewpoint of reflow crack resistance, aralkyl phenolic resins, dicyclopentadiene phenolic resins, salicylaldehyde phenolic resins, benzaldehyde aralkyl copolymer phenolic resins, and novolac phenolic resins are preferred. These aralkyl phenolic resins, dicyclopentadiene phenolic resins, salicylaldehyde phenolic resins, benzaldehyde aralkyl copolymer phenolic resins, and novolac phenolic resins may be used either alone, or in combinations of two or more different resins. In order to ensure satisfactory manifestation of the performance of these preferred resins, the total quantity of these preferred resins, relative to the total quantity of phenolic resins, is preferably at least 30% by weight, and is even more preferably 50% by weight or greater.

There are no particular restrictions on the aralkyl phenolic resins, provided they are phenolic resins synthesized from a phenol and/or a naphthol, and dimethoxyparaxylene or bis (methoxymethyl)biphenyl or a derivative thereof, but phenolic resins represented by general formulas (XII) to (XIV) shown below are preferred.

[Formula 16]

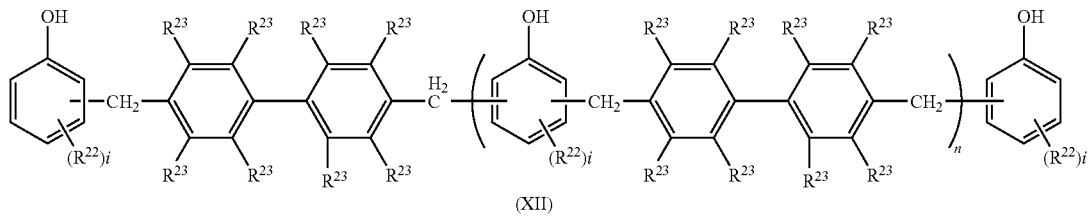

(XII)

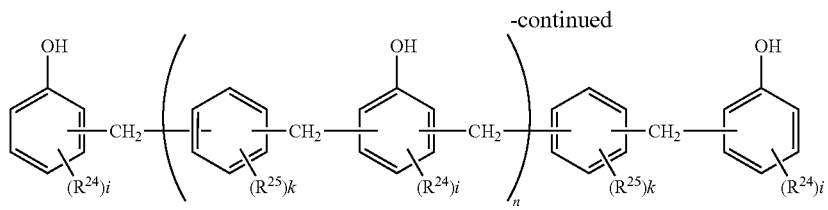

(XIII)

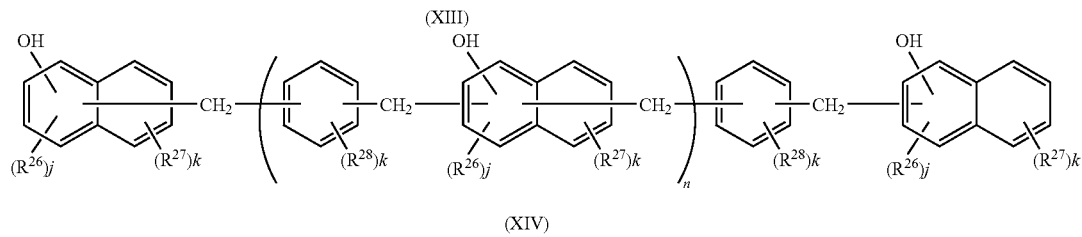

(XIV)

(In the formulas (XII) to (XIV), $R^{22}$ to $R^{28}$ represent hydrogen atoms or monovalent organic groups of 1 to 18 carbon atoms, wherein these groups may be either all the same or different, i represents an integer from 0 to 3, k represents an integer from 0 to 4, j represents an integer from 0 to 2, and n is an average value that represents a positive number from 0 to 10.)

Of the phenolic resins represented by the above general formula (XII), resins such as the resin in which i=0 and all of the $R^{23}$ groups are hydrogen atoms (product name: MEH-7851, manufactured by Meiwa Plastic Industries, Ltd.) are available as commercial products.

Of the phenolic resins represented by the above general formula (XIII), resins such as the resin in which i=0 and k=0 (product names: XL-225 and XLC, manufactured by Mitsui Chemicals, Inc.) are available as commercial products.

Of the phenolic resins represented by the above general formula (XIV), resins such as the resin in which j=0, the $R^{27}$ k value=0, and the $R^{28}$ k value=0 (product name: SN-170, manufactured by Nippon Steel Chemical Group) are available as commercial products.

There are no particular restrictions on the dicyclopentadiene phenolic resins, provided they are phenolic resins prepared using a compound with a dicyclopentadiene backbone as a raw material, but phenolic resins represented by a general formula (XV) shown below are preferred. Of the phenolic resins represented by the general formula (XV) shown below, resins such as the resin in which i=0 (product name: DPP, manufactured by Nippon Petrochemicals Co., Ltd.) are available as commercial products.

[Formula 17]

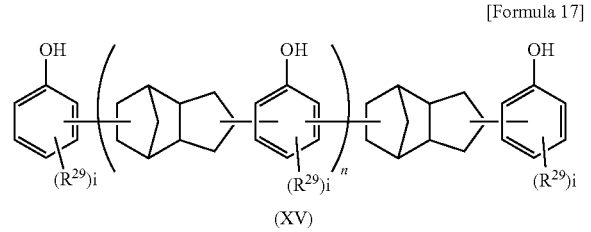

(XV)

(In the formula (XV), $R^{29}$ represents a hydrogen atom or a monovalent organic group of 1 to 18 carbon atoms, wherein these groups may be either all the same or different, i represents an integer from 0 to 3, and n is an average value that represents a positive number from 0 to 10.)

There are no particular restrictions on the salicylaldehyde phenolic resins, provided they are phenolic resins prepared using a compound with a salicylaldehyde backbone as a raw material, but phenolic resins represented by a general formula (XVI) shown below are preferred.

Of the phenolic resins represented by the general formula (XVI) shown below, resins such as the resin in which i=0 and k=0 (product name: MEH-7500, manufactured by Meiwa Plastic Industries, Ltd.) are available as commercial products.

[Formula 18]

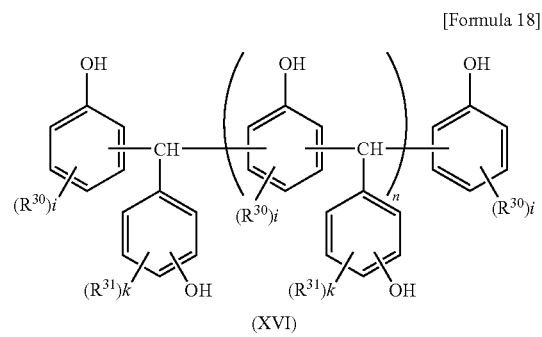

(XVI)

(In the formula (XVI), $R^{30}$ and $R^{31}$ represent hydrogen atoms or monovalent organic groups of 1 to 18 carbon atoms, wherein these groups may be either all the same or different, i represents an integer from 0 to 3, k represents an integer from 0 to 4, and n is an average value that represents a positive number from 0 to 10.)

There are no particular restrictions on the benzaldehyde aralkyl copolymer phenolic resins, provided they are copolymer phenolic resins of a phenolic resin obtained using a compound with a benzaldehyde backbone as a raw material, and an aralkyl phenolic resin, but phenolic resins represented by a general formula (XVII) shown below are preferred.

Of the phenolic resins represented by the general formula (XVII) shown below, resins such as the resin in which i=0, k=0, and q=0 (product name: HE-510, manufactured by Air Water Inc., Chemical Division) are available as commercial products.

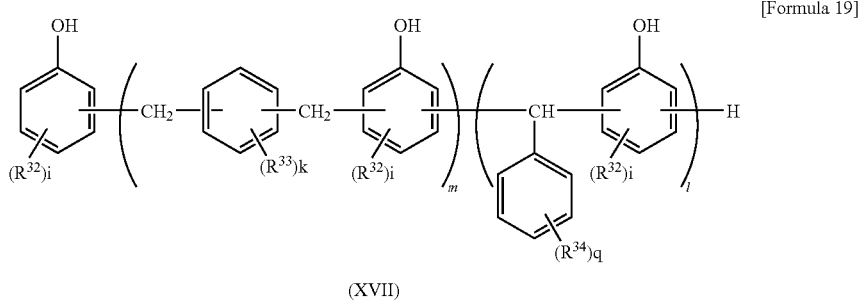

(XVII)

(In the formula (XVII), $R^{32}$ through $R^{34}$ represent hydrogen atoms or monovalent organic groups of 1 to 18 carbon atoms, wherein these groups may be either all the same or different, i represents an integer from 0 to 3, k represents an integer from 0 to 4, q represents an integer from 0 to 5, and 1 and m are both average values that each represent a positive number from 0 to 11, provided that (1+m) represents a positive number from 1 to 11.)

There are no particular restrictions on the novolac phenolic resins, provided they are phenolic resins obtained by condensing or co-condensing a phenol and/or a naphthol with an aldehyde in the presence of an acid catalyst, but phenolic resins represented by a general formula (XVIII) shown below are preferred.

Of the phenolic resins represented by the general formula (XVIII) shown below, resins such as the resin in which i=0, and all of the $R^{35}$ groups are hydrogen atoms (product names: Tamanol 758 and 759, manufactured by Arakawa Chemical Industries, Ltd., and HP-850N, manufactured by Hitachi Chemical Co., Ltd.) are available as commercial products.

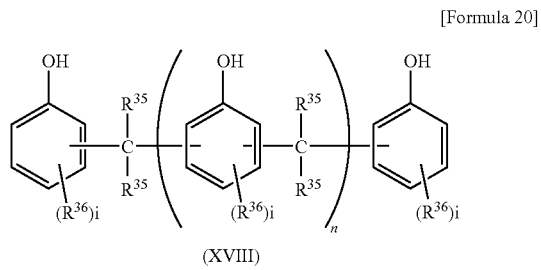

(XVIII)

(In the formula (XVIII), $R^{35}$ and $R^{36}$ represent hydrogen atoms or monovalent organic groups of 1 to 18 carbon atoms, wherein these groups may be either all the same or different, i represents an integer from 0 to 3, k represents an integer from 0 to 4, and n is an average value that represents a positive number from 0 to 10.)

In the above general formulas (XII) through (XVIII), the expression "these groups may be either all the same or different" used in relation to the groups $R^{22}$ through $R^{36}$ means that, for example, the i $R^{22}$ groups within the formula (XII) may be all the same, or each individual group may be different. Similarly, for each of the groups $R^{23}$ to $R^{36}$, the total number of all the groups of that type within a formula may be all the same, or each individual group may be different. Furthermore, the groups $R^{22}$ through $R^{36}$ may be the same as each other or different. For example, all of the $R^{22}$ and $R^{23}$ groups may be the same, or they may be different, and all of the $R^{30}$ and $R^{31}$ groups may be the same, or they may be different.

The value of n within the above general formulas (XII) through (XVIII) must fall within a range from 0 to 10, and if the value exceeds 10, the melt viscosity of the curable resin component (B) increases, which causes an increase in the viscosity of the curable resin composition during melt molding, and increases the likelihood of incomplete filling faults, and deformation of the bonding wires (the metal lines used to connect elements and leads). The average value of n within each molecule is preferably set within a range from 0 to 4.

In a curable resin composition according to the present invention, in those cases where an epoxy resin is used as the curable resin (B) and a phenolic resin is used as the curing agent (C) for the epoxy resin, the blend ratio between the components (B) and (C) is preferably set so that the ratio of the hydroxyl group equivalent weight of the overall phenolic resin relative to the epoxy equivalent weight of the overall epoxy resin (the number of hydroxyl groups within the phenolic resin/the number of epoxy groups within the epoxy resin) falls within a range from 0.5 to 2.0, and this ratio is even more preferably within a range from 0.7 to 1.5, and most preferably from 0.8 to 1.3. If this ratio is less than 0.5, then the epoxy resin curing is inadequate, which tends to cause a deterioration in the heat resistance, moisture resistance, and electrical properties of the cured product. In contrast, if the above ratio exceeds 2.0, then an excess of the phenolic resin component develops, which not only reduces the curing efficiency, but also tends to cause a deterioration in the electrical properties and the moisture resistance of the package due to a large quantity of phenolic hydroxyl groups to be retained within the cured resin.

(D) Inorganic Filler

An inorganic filler (D) may also be added to a curable resin composition of the present invention according to need. Particularly in those cases where the curable resin composition is used as an encapsulating molding material, the addition of an inorganic filler (D) is preferred. There are no particular restrictions on the types of inorganic filler (D) that can be used in the present invention, and any of the fillers typically used within encapsulating molding materials are suitable.

Suitable examples include fine powders of materials such as fused silica, crystalline silica, glass, alumina, calcium carbonate, zirconium silicate, calcium silicate, silicon nitride, aluminum nitride, boron nitride, beryllia, zirconia, zircon, forsterite, steatite, spinel, mullite, titania, talc, clay and mica, or spherical beads of any of these materials. Moreover, examples of inorganic fillers that exhibit a flame retardant effect include aluminum hydroxide, magnesium hydroxide, composite metal hydroxides such as a composite hydroxide of magnesium and zinc, and zinc borate.

Of these, fused silica is preferred from the viewpoint of reducing the coefficient of linear expansion, and alumina is preferred from the viewpoint of achieving a high level of thermal conductivity. These inorganic fillers may be used either alone, or in combinations of two or more different fillers.

There are no particular restrictions on the blend quantity of the inorganic filler (D), provided the effects of the present invention are obtained, but a filler blend quantity within a range from 55 to 90% by volume relative to the curable resin composition is preferred. These inorganic fillers are added for the purpose of improving the coefficient of thermal expansion, thermal conductivity and elastic modulus and the like of the cured product, and if the blend quantity is less than 55% by volume, then the improvements in these properties tend to be inadequate, whereas if the blend quantity exceeds 90% by volume, then the viscosity of the curable resin composition tends to increase, causing a reduction in fluidity and making molding more difficult.

The average particle size of the inorganic filler (D) is preferably within a range from 1 to 50 μm, and even more preferably from 10 to 30 μm. If the particle size is less than 1 μm, then the viscosity of the curable resin composition is more likely to increase, whereas if the particle size exceeds 50 μm, then the resin component and the inorganic filler become prone to separation, which causes the cured product to lose uniformity, and tends to cause fluctuations in the properties of the cured product and a deterioration in the ability of the cured product to fill narrow spaces.

From the viewpoint of fluidity, the particle shape of the inorganic filler (D) is preferably spherical rather than angular, and the particle size distribution of the inorganic filler (D) is preferably broad. For example, in the case where the composition contains 75% by volume or more of the inorganic filler, then 70% by weight or greater of the filler is preferably spherical particles, and the particle sizes are preferably distributed over a broad range from 0.1 to 80 μm. Because this type of inorganic filler facilitates the closest packing structures, the blend quantity of the filler can be increased with minimal increase in the viscosity of the material, enabling a curable resin composition with excellent fluidity to be obtained.

(Additives)

In a curable resin composition according to the present invention, in addition to the aforementioned components, namely the curing accelerator (A), the curable resin (B), the curing agent (C) and the inorganic filler (D), if required a variety of other additives such as the coupling agents, ion exchangers, release agents, stress releasers, flame retardants and colorants described below may also be added. However, the additives that can be added to a curable resin composition of the present invention are not restricted to those listed below, and any of the various conventional additives from this technical field may be added according to need.

(Coupling Agents)

Conventional coupling agents can be added to a encapsulating curable resin composition of the present invention according to need, for the purpose of improving the adhesion between the resin component and the inorganic filler, and examples of suitable coupling agents include various silane compounds such as epoxysilanes, mercaptosilanes, aminosilanes, alkylsilanes, ureidosilanes and vinylsilanes, as well as titanium compounds, aluminum chelates, and aluminum/zirconium compounds.

The blend quantity of the coupling agent is preferably within a range from 0.05 to 5% by weight, and even more preferably from 0.1 to 2.5% by weight, relative to the inorganic filler (D). If the blend quantity is less than 0.05% by weight, then the adhesion to the frame tends to deteriorate, whereas if the quantity exceeds 5% by weight, the moldability of the package tends to deteriorate.

Examples of the above coupling agents include silane-based coupling agents such as vinyltrichlorosilane, vinyltriethoxysilane, vinyltris(β-methoxyethoxy)silane, γ-methacryloxypropyltrimethoxysilane, β-(3,4-epoxydicyclohexyl) ethyltrimethoxysilane, γ-glycidoxypropyltrimethoxysilane, γ-glycidoxypropylmethyldimethoxysilane, vinyltriacetoxysilane, γ-mercaptopropyltrimethoxysilane, γ-aminopropyltriethoxysilane, γ-anilinopropyltrimethoxysilane, γ-anilinopropylmethyldimethoxysilane, γ-[bis(β-hydroxyethyl)]aminopropyltriethoxysilane, N-β-(aminoethyl)-γ-aminopropyltrimethoxysilane, γ-(β-aminoethyl)aminopropyldimethoxymethylsilane, N-(trimethoxysilylpropyl)ethylenediamine, N-(dimethoxymethylsilylisopropyl)ethylenediamine, methyltrimethoxysilane, dimethyldimethoxysilane, methyltriethoxysilane, N-β-(N-vinylbenzylaminoethyl)-γ-aminopropyltrimethoxysilane, γ-chloropropyltrimethoxysilane, hexamethyldisilane, vinyltrimethoxysilane and γ-mercaptopropylmethyldimethoxysilane; and titanate-based coupling agents such as isopropyltriisostearoyl titanate, isopropyltris (dioctyl pyrophosphate) titanate, isopropyltri(N-aminoethyl-aminoethyl)titanate, tetraoctylbis(ditridecyl phosphite) titanate, tetra(2,2-diallyloxymethyl-1-butyl)bis(ditridecyl) phosphite titanate, bis(dioctyl pyrophosphate)oxyacetate titanate, bis(dioctyl pyrophosphate) ethylene titanate, isopropyltrioctanoyl titanate, isopropyldimethacrylisostearoyl titanate, isopropyltridodecylbenzenesulfonyl titanate, isopropylisostearoyldiacryl titanate, isopropyltri(dioctyl phosphate)titanate, isopropyltricumylphenyl titanate and tetraisopropylbis(dioctyl phosphite)titanate, and these coupling agents may be used either alone, or in combinations of two or more different materials. Of these, coupling agents containing a secondary amino group are preferred from the viewpoints of fluidity and wire flow.

(Ion Exchangers)

An anion exchanger may also be added to a curable resin composition of the present invention according to need. Particularly in those cases where the curable resin composition is used as an encapsulating molding material, an anion exchanger is preferably added from the viewpoints of improving the moisture resistance and high-temperature storage properties of electronic parts devices comprising elements requiring encapsulation. There are no particular restrictions on the anion exchangers that can be used in the present invention, and conventional exchangers can be used, including hydrotalcites, and hydroxides or the like of elements selected from amongst magnesium, aluminum, titanium, zirconium and bismuth, and these materials may be used either alone, or in combinations of two or more different materials. Of these, hydrotalcites represented by a general formula (XIX) shown below are preferred.

(Formula 21)

$$Mg_{1-x}Al_x(OH)_2(CO_3)_{x/2} \cdot mH_2O \tag{XIX}$$

(wherein, $0 < x \leq 0.5$, and m is a positive number)

There are no particular restrictions on the blend quantity of these anion exchangers, which need only be sufficient to enable capture of anions such as halogen ions and the like, but a quantity within a range from 0.1 to 30% by weight relative to the curable resin (B) is preferred, and a quantity from 1 to 5% by weight is even more desirable.

(Release Agents)

A release agent may be added to a curable resin composition of the present invention in order to ensure favorable releasability between the composition and the die during molding. There are no particular restrictions on the release agents that can be used in the present invention, and conventional materials can be used. Examples include higher fatty acids such as carnauba wax, montanic acid and stearic acid, metal salts of higher fatty acids, ester-based waxes such as montanate esters, and polyolefin-based waxes such as oxidized polyethylene and unoxidized polyethylene, and any of these release agents may be used either alone, or in combinations of two or more different materials. Of these, oxidized or unoxidized polyolefin-based waxes are preferred, and the blend quantity is preferably within a range from 0.01 to 10% by weight, and even more preferably from 0.1 to 5% by weight, relative to the curable resin (B). If the blend quantity of the polyolefin-based wax is less than 0.01% by weight, then the releasability tends to be unsatisfactory, whereas if the quantity exceeds 10% by weight, then the adhesion of the composition may be inhibited. Specific examples of commercially available polyolefin-based waxes include the H4, PE and PED series of waxes manufactured by Hoechst AG, which are low molecular weight polyethylenes with number average molecular weights within a range from approximately 500 to 10,000. Furthermore, in those cases where other release agents are used in combination with a polyolefin-based wax, the blend quantity relative to the curable resin (B) is preferably within a range from 0.1 to 10% by weight, and even more preferably from 0.5 to 3% by weight.

(Stress Releasers)

Stress releasers such as silicone oils or silicone rubber powders may also be added to a curable resin composition of the present invention according to need. By adding a stress releaser, the degree of warping of the package and the occurrence of package cracking can be reduced. There are no particular restrictions on the stress releasers that can be used, and any of the typically employed conventional flexibility agents (stress releasers) are suitable. Specific examples of typically used flexibility agents include thermoplastic elastomers such as silicone-based, styrene-based, olefin-based, urethane-based, polyester-based, polyether-based, polyamide-based or polybutadiene-based elastomers, rubber particles such as NR (natural rubber), NBR (acrylonitrile-butadiene rubber), acrylic rubber, urethane rubber and silicone powders, and rubber particles with core-shell structures such as methyl methacrylate-styrene-butadiene copolymers (MBS), methyl methacrylate-silicone copolymers and methyl methacrylate-butyl acrylate copolymers, and these flexibility agents may be used either alone, or in combinations of two or more different materials. Of these, silicone-based flexibility agents are preferred, and examples of such silicone-based flexibility agents include materials containing epoxy groups and materials containing amino groups, as well as polyether-modified products thereof.

(Flame Retardants)

A flame retardant may be added to a curable resin composition of the present invention according to need, in order to impart flame retardancy to the composition. There are no particular restrictions on the flame retardants that can be used in the present invention, and suitable examples include conventional organic or inorganic compounds containing halogen atoms, antimony atoms, nitrogen atoms or phosphorus atoms, and metal hydroxides, and these flame retardants may be used either alone, or in combinations of two or more different compounds. There are no particular restrictions on the blend quantity of the flame retardant, provided a satisfactory flame retardancy effect is achieved, but a quantity within a range from 1 to 30% by weight, and even more preferably from 2 to 15% by weight, relative to the epoxy resin or the like of the curable resin (B) is preferred.

(Colorants)

Furthermore, conventional colorants such as carbon black, organic dyes, organic pigments, titanium oxide, red lead oxide, and red iron oxide may also be added.

A curable resin composition of the present invention described above can be prepared by any suitable method, provided the various components are able to dispersed and mixed together uniformly. In a typical method, predetermined blend quantities of the components are mixed together thoroughly using a mixer or the like, melt kneading is conducted using a mixing roller or an extruder or the like, and the mixture is then cooled and crushed. More specifically, predetermined quantities of the components described above are stirred and mixed together uniformly, the mixture is kneaded using a kneader, roller or extruder that has been preheated to a temperature of 70 to 140° C., and is then cooled and crushed. Handling can be facilitated by converting the resin composition to tablets with dimensions and weight that are appropriate for the package molding conditions.

[Electronic Parts Device]

An electronic parts device that represents another aspect of the present invention comprises an element that has been encapsulated using an aforementioned curable resin composition. Examples of the electronic parts device include devices in which one or more elements, including active elements such as a semiconductor chip, transistor, diode or thyristor, and passive elements such as a capacitor, resistor or coil, are mounted on a support member such as a lead frame, a wired tape carrier, a wiring board, a glass sheet or a silicon wafer, wherein these elements are encapsulated with a curable resin composition of the present invention. More specific examples include typical resin-encapsulated ICs such as DIP (Dual Inline Package), PLCC (Plastic Leaded Chip Carrier), QFP (Quad Flat Package), SOP (Small Outline Package), SOJ (Small Outline J-lead package), TSOP (Thin Small Outline Package) and TQFP (Thin Quad Flat Package), wherein a semiconductor element is secured to a lead frame, the element electrodes such as bonding pads, and the lead portions are connected via wire bonding or bumps, and the package is then encapsulated by transfer molding using a curable resin composition of the present invention; TCP (Tape Carrier Package) wherein a semiconductor chip connected by bumps to a tape carrier is encapsulated using a curable resin composition of the present invention; COB (Chip on Board) modules, hybrid IC and multi-chip modules, wherein active elements such as a semiconductor chip, transistor, diode or thyristor, and/or passive elements such as a capacitor, resistor or coil that have been connected to a wiring board or wiring on a glass substrate by wire bonding, flip chip bonding or soldering are encapsulated using a curable resin composition of the present invention; and BGA (Ball Grid Array) and CSP (Chip Size Package), wherein an element is mounted on the surface of an organic substrate that has terminals for connecting to a wiring board provided on the underside thereof, the element and wiring formed on the organic substrate are connected using bumps or wire bonding, and the element is then encapsulated using a curable resin composition of the present invention. Furthermore, a curable resin composition of the present invention can also be used effectively with printed circuit boards.

The most common method used for encapsulating an electronic parts device using a curable resin composition of the present invention is low-pressure transfer molding, but injection molding methods and compression molding methods and the like may also be used.

EXAMPLES

As follows is a more detailed description of the present invention based on a series of examples, although the scope of the present invention is in no way limited by the examples presented below, and various modifications are, of course, possible without departing from the gist of the present invention.

[Preparation of Curing Accelerators]

Prior to preparation of curable resin compositions, the compounds used as curing accelerators within each of the examples of the present invention were prepared in accordance with synthesis examples 1 through 9 described below. In each of the synthesis examples, the raw materials 4-triphenylphosphoniophenolate, 2-triphenylphosphoniophenolate, 3-triphenylphosphoniophenolate, 2,6-dimethyl-4-triphenylphosphoniophenolate, 3-tri-p-tolylphosphoniophenolate, and cyclohexyldiphenylphosphoniophenolate were synthesized in accordance with the method disclosed in Japanese Patent Laid-Open No. 2004-156036.

Furthermore, analyses of the compounds prepared in each of the synthesis examples were conducted using the methods described below.

(1) $^1$H-NMR

The compound was dissolved in approximately 0.5 ml of heavy acetone, and the solution was placed in a φ5 mm test tube and measured using an AV-300M manufactured by Bruker BioSpin Corporation. Shift values were recorded relative to a small quantity of a CHD$_2$C(=O)CD$_3$ standard (2.04 ppm) included within the solvent.

(2) $^{31}$P-NMR

The compound was dissolved in approximately 0.5 ml of heavy methanol or heavy acetone, and the solution was placed in a φ5 mm test tube and measured using an AV-300M manufactured by Bruker BioSpin Corporation. Shift values were recorded relative to a phosphoric acid aqueous solution standard (0 ppm).

(3) IR

Measured in accordance with a KBr method, using a FTS 3000MX manufactured by Bio-Rad Laboratories, Inc.

Synthesis Example 1

10.9 g (30.8 mmol) of 4-triphenylphosphoniophenolate was dispersed (and partially dissolved) in 100 ml of acetone, and 10.0 g (46.2 mmol) of diphenylsilanediol was then added to the solution with constant stirring. The faint yellow-colored powder of 4-triphenylphosphoniophenolate within the solution gradually changed to a white color. Because the diphenylsilanediol is soluble in acetone, it is surmised that this change is because the portion of 4-triphenylphosphoniophenolate dissolved in the acetone reacts with the diphenylsilanediol and is gradually consumed, and the resulting salt of 4-triphenylphosphoniophenolate and diphenylsilanediol then precipitates out from the solution. The reaction mixture was stirred for 12 hours at room temperature, and the product was then filtered and dried, yielding 16.3 g of a white solid product.

Figure 2:
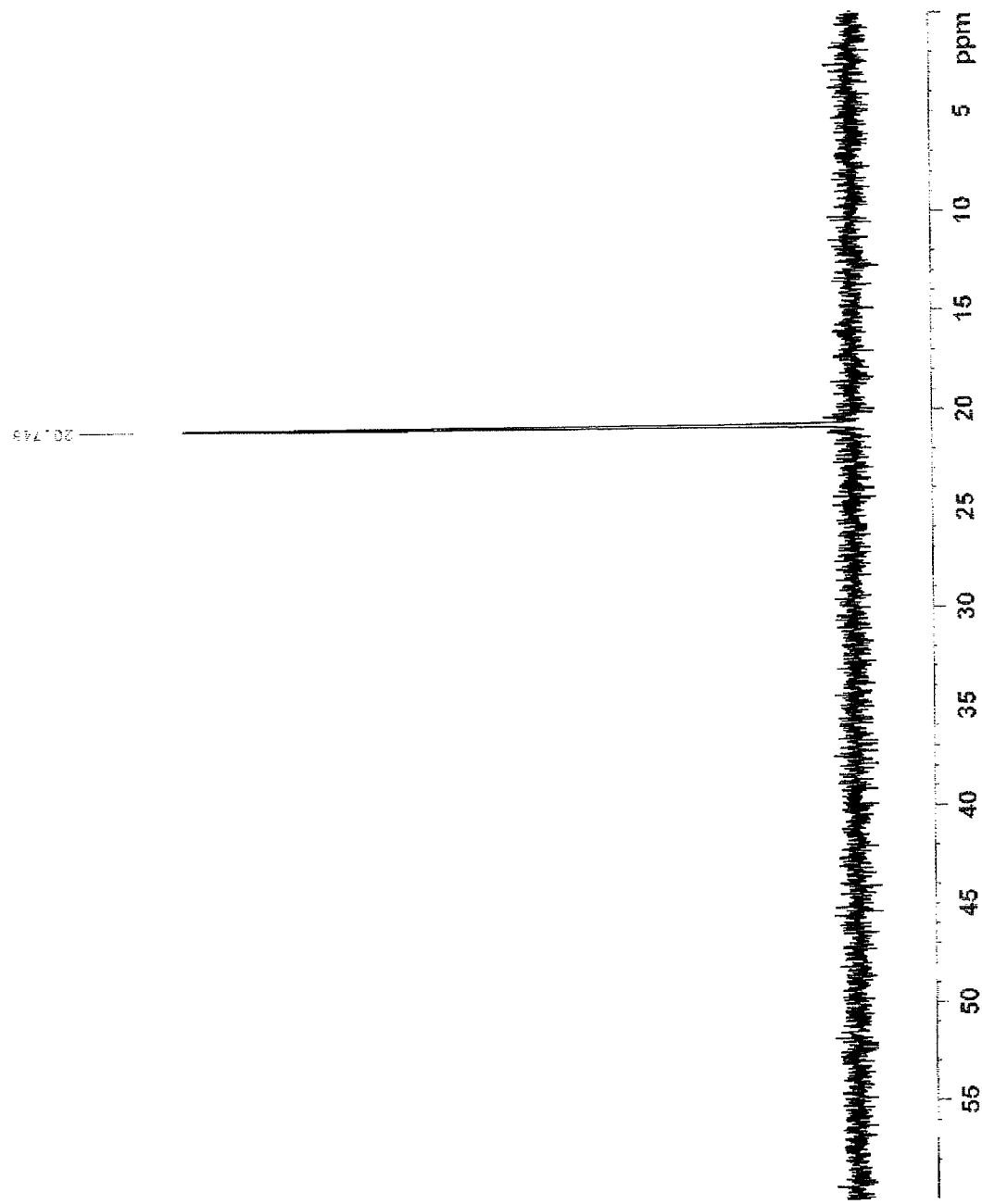
FIG. 2 is a $^{31}$P-NMR spectrum of the compound 1 prepared as a curing accelerator according to the present invention.
Figure 3:
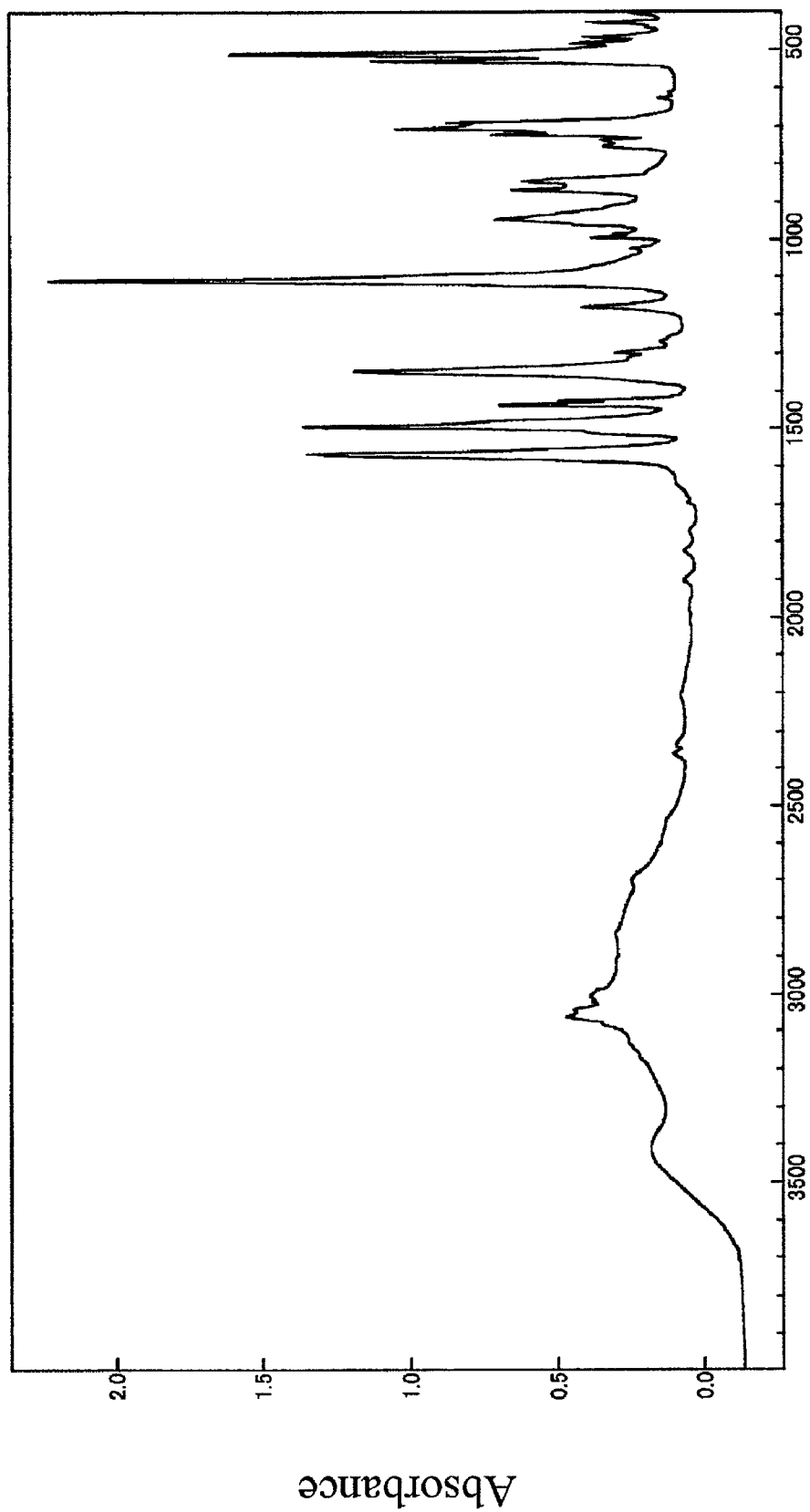
FIG. 3 is an IR spectrum of the compound 1 prepared as a curing accelerator according to the present invention.

$^1$H-NMR measurement, $^{31}$P-NMR measurement (conducted in heavy methanol), and IR measurement of the thus obtained product yielded the spectra shown in FIG. 1 through FIG. 3 respectively. Identification of each spectrum suggests that the product has a structure shown below in formula (XX) (hereafter, referred to as "compound 1"). The yield was 93%.

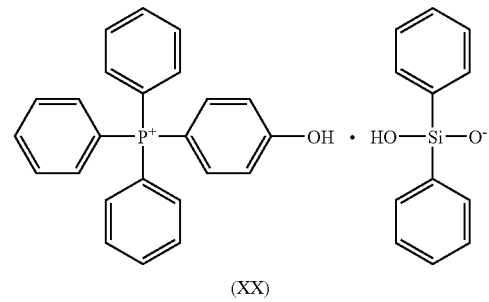

[Formula 22]

(XX)

Synthesis Example 2

30.0 g (84.6 mmol) of 4-triphenylphosphoniophenolate was dispersed (and partially dissolved) in 60 ml of acetone and 30 ml of distilled water, and 18.3 g (84.6 mmol) of diphenylsilanediol was then added to the solution with constant stirring. As the diphenylsilanediol was added, the 4-triphenylphosphoniophenolate dissolved, and a white powder then precipitated out almost immediately. The reaction mixture was stirred for 30 minutes at room temperature, approximately 30 ml of acetone was removed by distillation using an evaporator, and the product was then filtered and dried, yielding 43.5 g of a white solid product.

$^1$H-NMR measurement, $^{31}$P-NMR measurement (conducted in heavy methanol), and IR measurement of the thus obtained product yielded the same spectra as the synthesis example 1. Accordingly, in the same manner as the synthesis example 1, it is thought that the product has the structure shown above in the formula (XX) (hereafter, referred to as "compound 1"). The yield was 90%.

Synthesis Example 3

10.9 g (30.8 mmol) of 4-triphenylphosphoniophenolate was dispersed (and partially dissolved) in 100 ml of acetone, and 25.5 g (46.2 mmol) of triphenylsilanol was then added to the solution with constant stirring. The faint yellow-colored powder of 4-triphenylphosphoniophenolate within the solution gradually changed to a white color. Because the triphenylsilanol is soluble in acetone, it is surmised that this change is because the portion of 4-triphenylphosphoniophenolate dissolved in the acetone reacts with the triphenylsilanol and is gradually consumed, and the resulting salt of 4-triphenylphosphoniophenolate and triphenylsilanol then precipitates out from the solution. The reaction mixture was stirred for 12 hours at room temperature, and the product was then filtered and dried, yielding 25.3 g of a white solid product.

Figure 4:
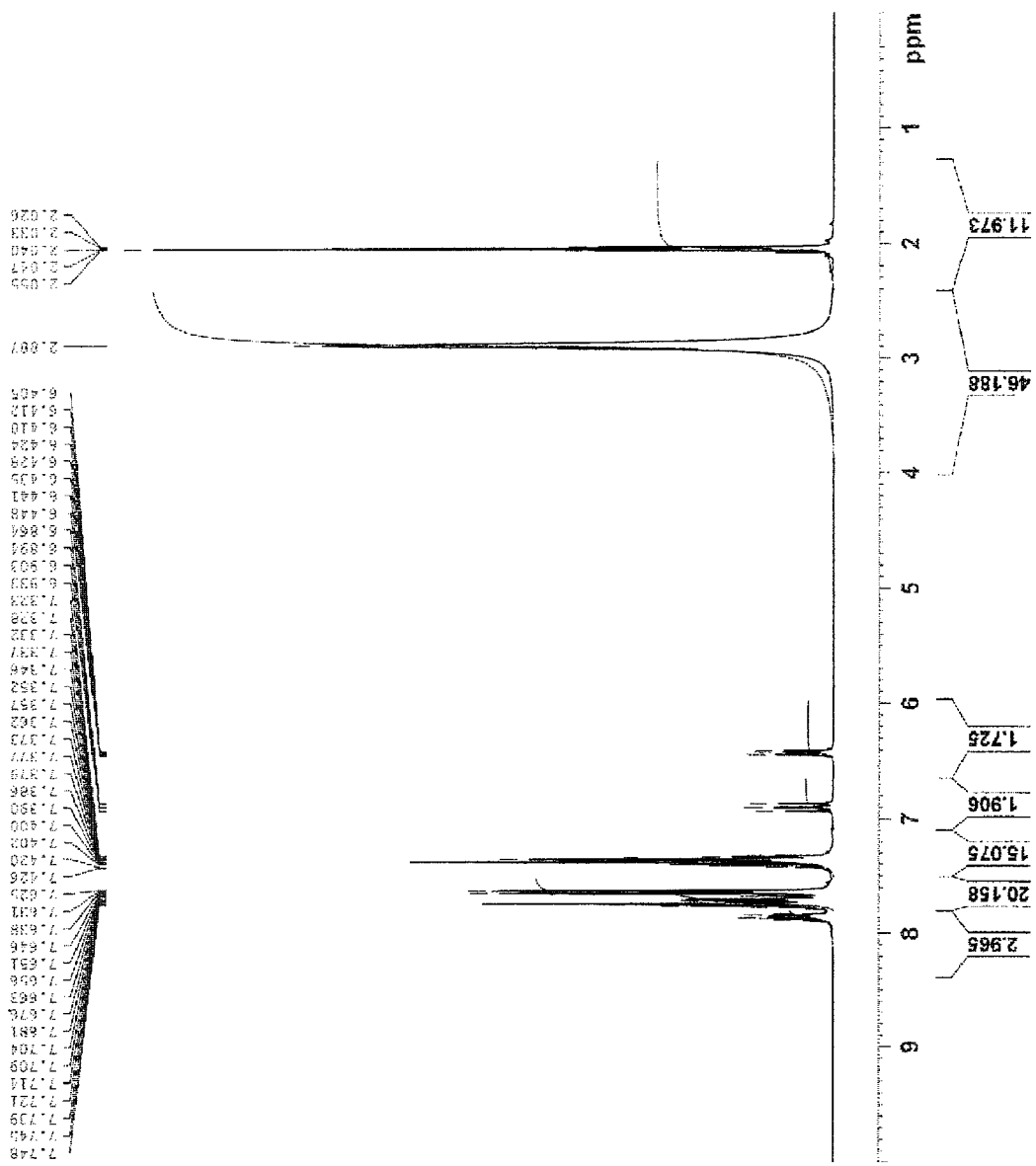
FIG. 4 is a $^1$H-NMR spectrum of a compound 2 prepared as a curing accelerator according to the present invention.
Figure 5:
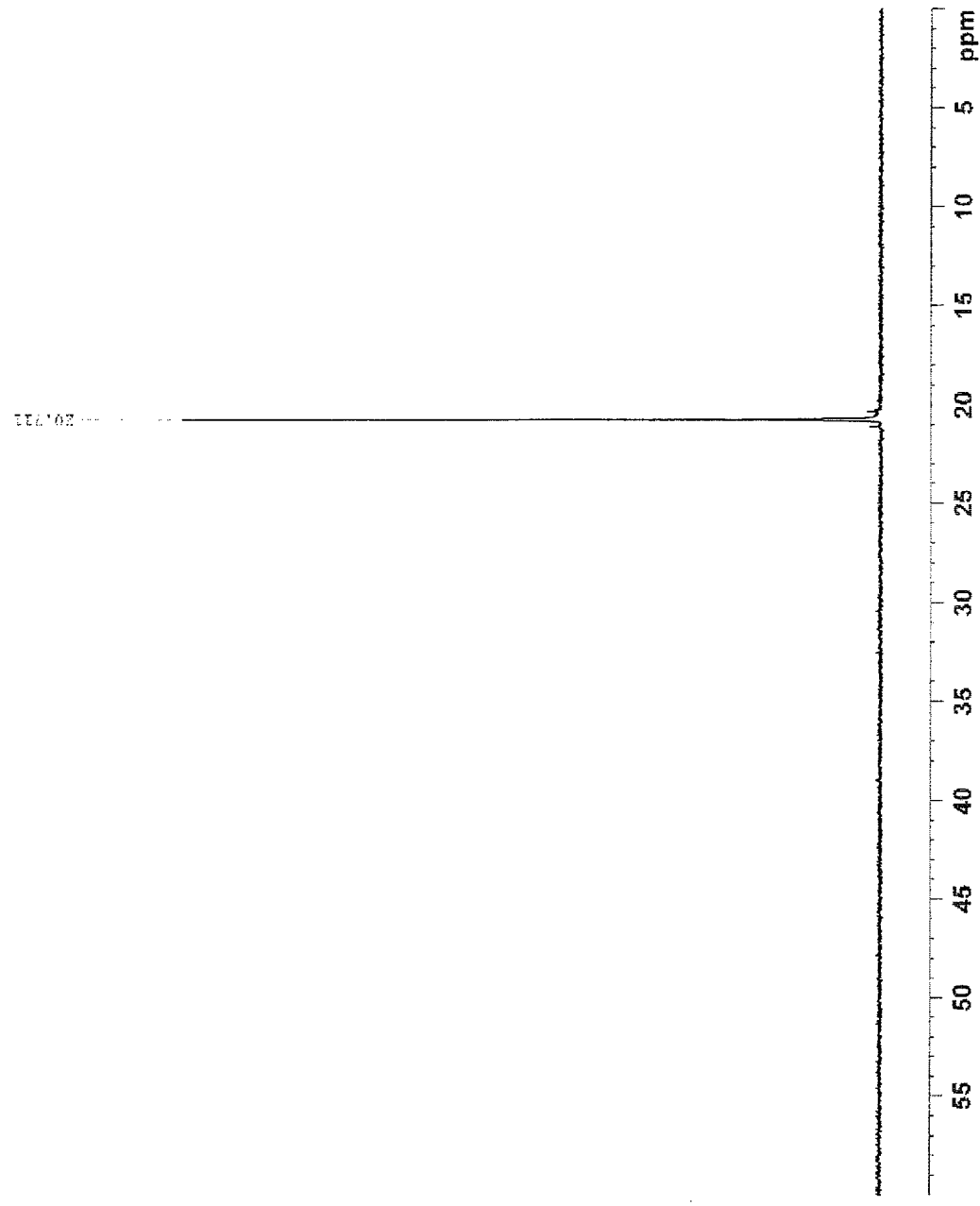
FIG. 5 is a $^{31}$P-NMR spectrum of the compound 2 prepared as a curing accelerator according to the present invention.
Figure 6:
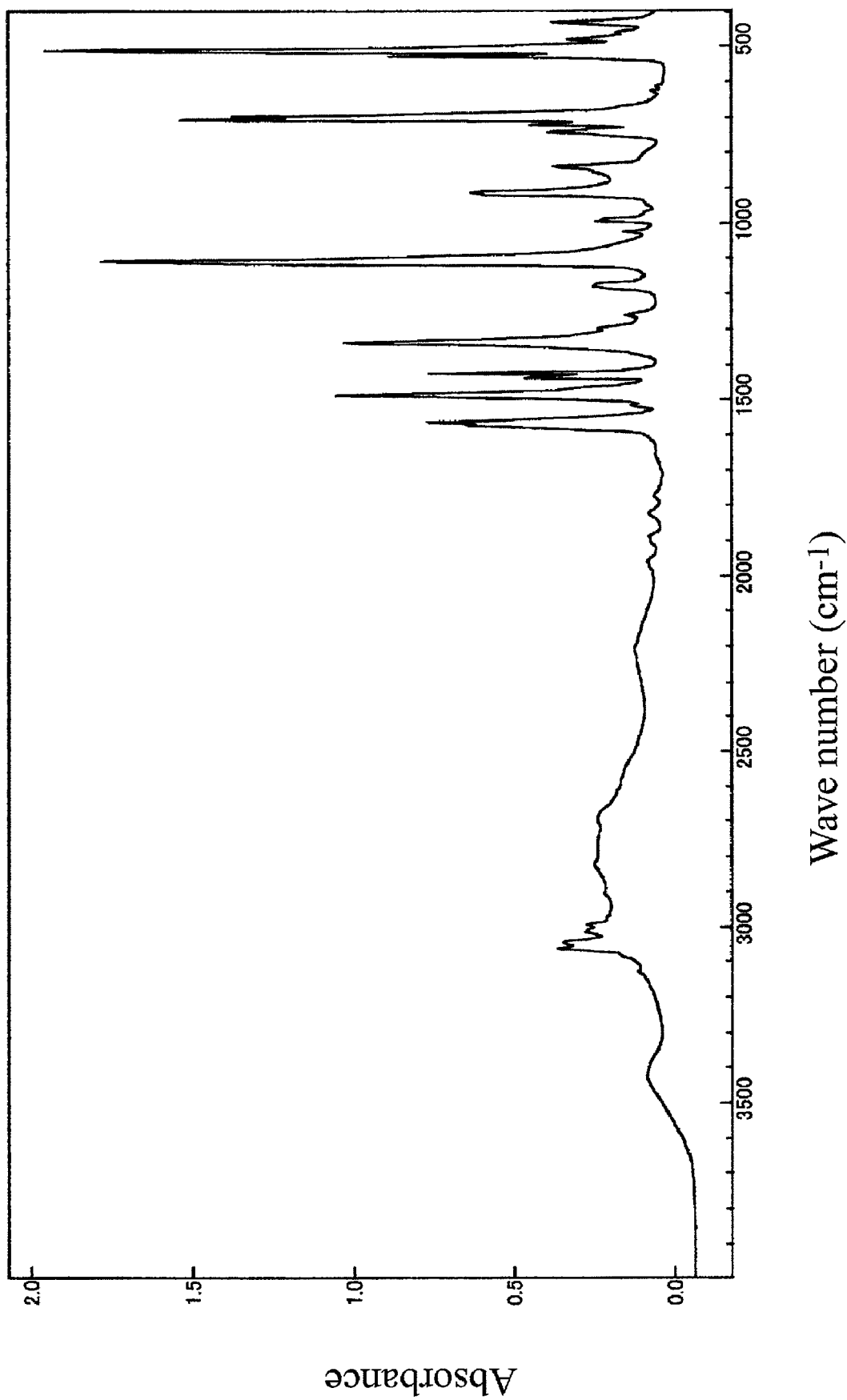
FIG. 6 is an IR spectrum of the compound 2 prepared as a curing accelerator according to the present invention.

$^1$H-NMR measurement, $^{31}$P-NMR measurement (conducted in heavy methanol), and IR measurement of the thus obtained product yielded the spectra shown in FIG. 4 through FIG. 6 respectively. Identification of each spectrum suggests that the product has a structure shown below in formula (XXI) (hereafter, referred to as "compound 2"). The yield was 91%.

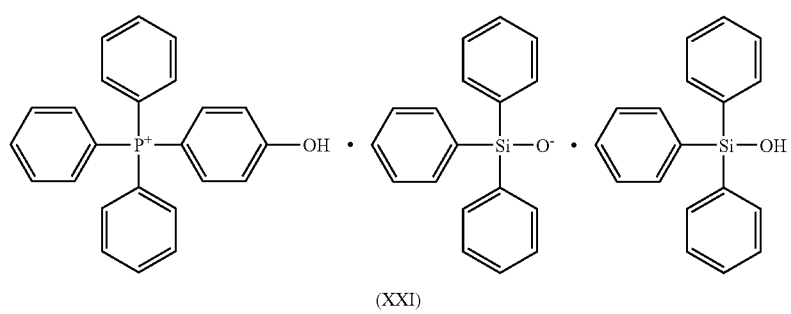

(XXI)

Synthesis Example 4

20.0 g (56.4 mmol) of 4-triphenylphosphoniophenolate was dissolved in 40 ml of acetone and 20 ml of distilled water, and 31.2 g (112.5 mmol) of triphenylsilanol was then added to the solution with constant stirring. When the triphenylsilanol was added, a white powder precipitated out immediately. The reaction mixture was stirred for 30 minutes at room temperature, approximately 30 ml of acetone was removed by distillation using an evaporator, and the product was then filtered and dried, yielding 45.7 g of a white solid product.

$^1$H-NMR measurement, $^{31}$P-NMR measurement (conducted in heavy methanol), and IR measurement of the thus obtained product yielded the same spectra as the synthesis example 3. Accordingly, in the same manner as the synthesis example 3, it is thought that the product has the structure shown above in the formula (XXI) (hereafter, referred to as "compound 2"). The yield was 89%.

Synthesis Example 5

6.4 g (18.1 mmol) of 2-triphenylphosphoniophenolate was dissolved in 30 ml of acetone and 7.5 ml of distilled water, and 15.0 g (54.3 mmol) of triphenylsilanol was then added to the solution with constant stirring. As the triphenylsilanol was added, a white powder gradually precipitated out. The reaction mixture was stirred for 2 hours at room temperature, and the product was then filtered and dried, yielding 13.8 g of a white solid product.

Figure 7:
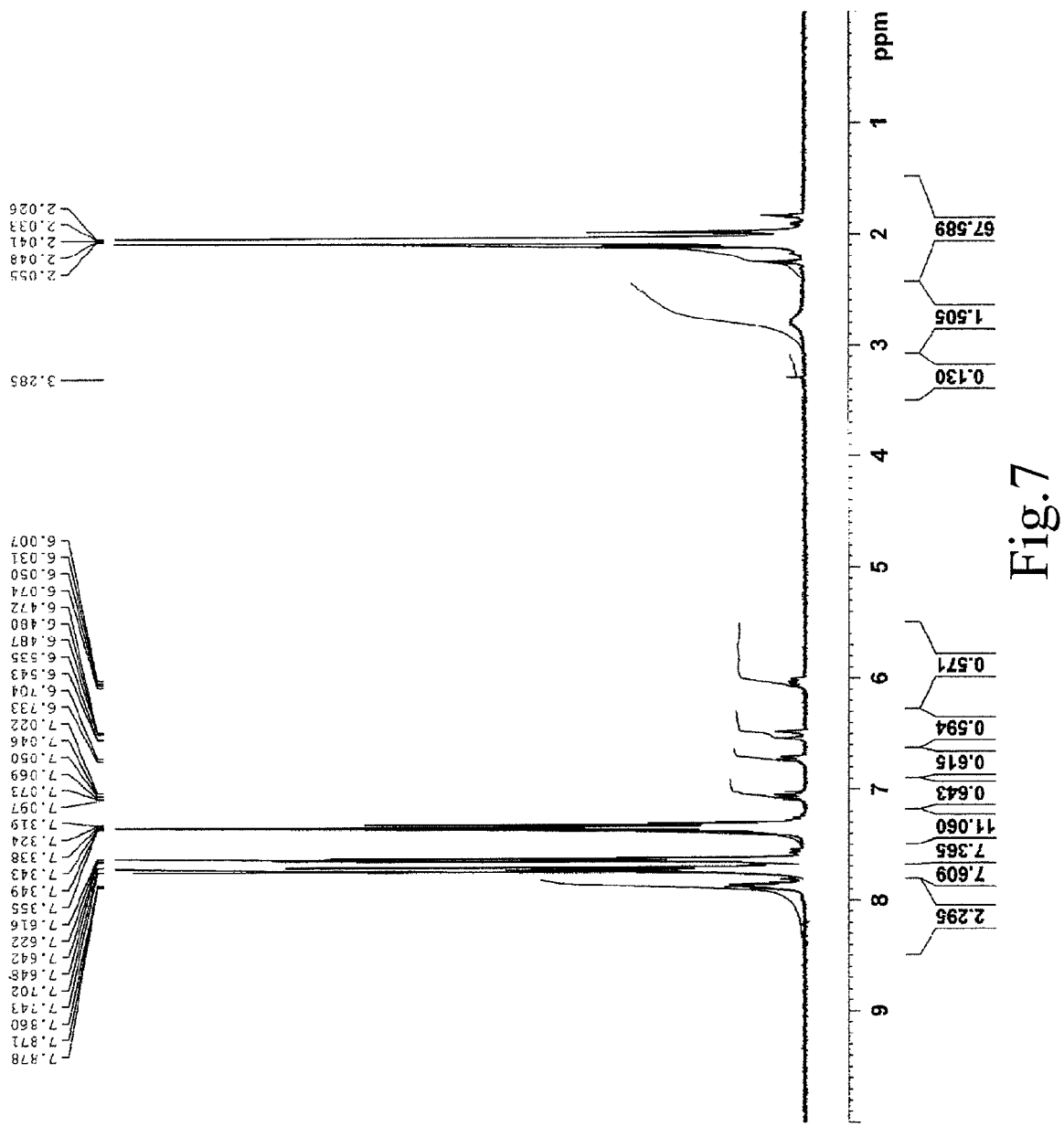
FIG. 7 is a $^1$H-NMR spectrum of a compound 3 prepared as a curing accelerator according to the present invention.
Figure 8:
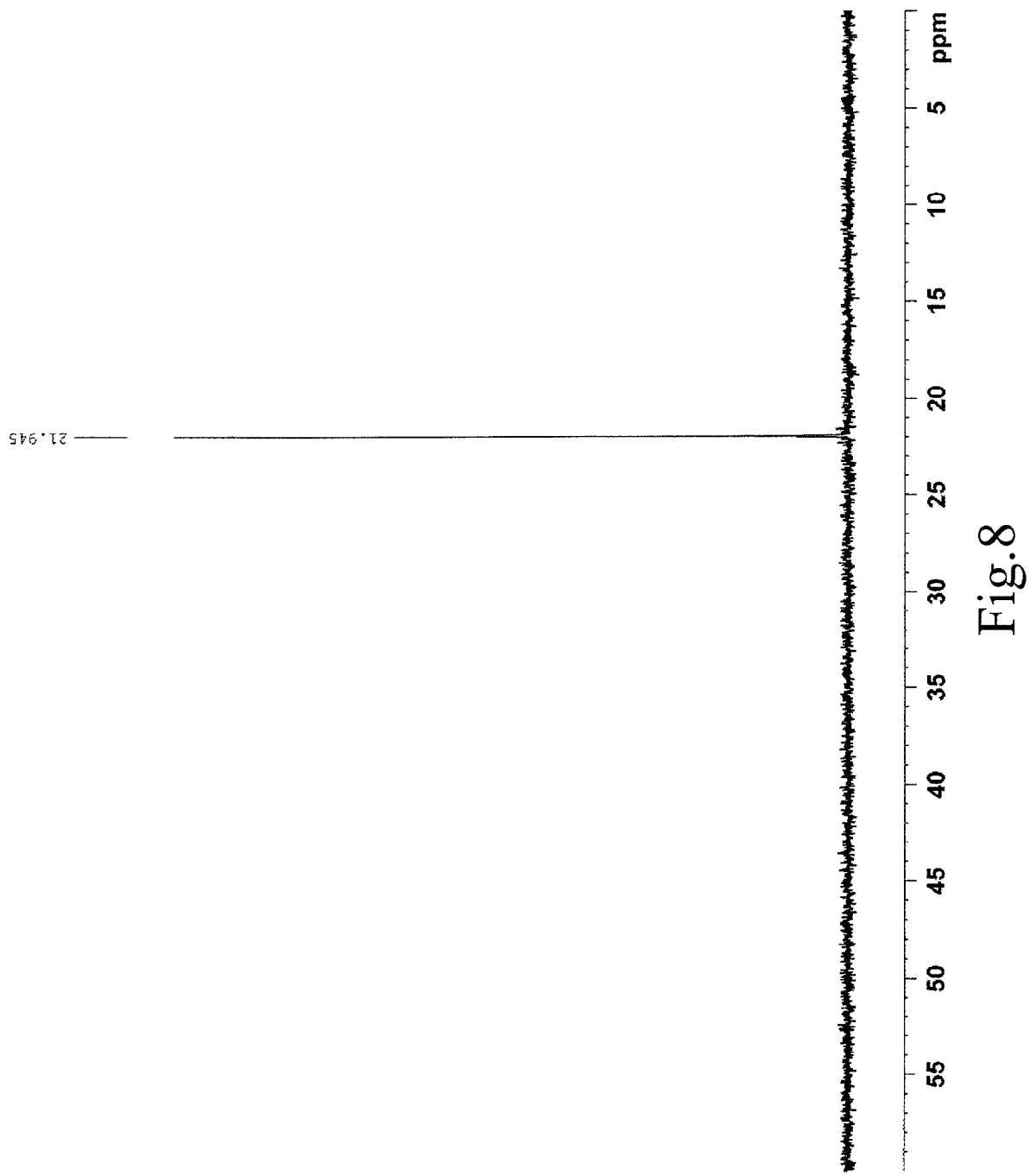
FIG. 8 is a $^{31}$P-NMR spectrum of the compound 3 prepared as a curing accelerator according to the present invention.
Figure 9:
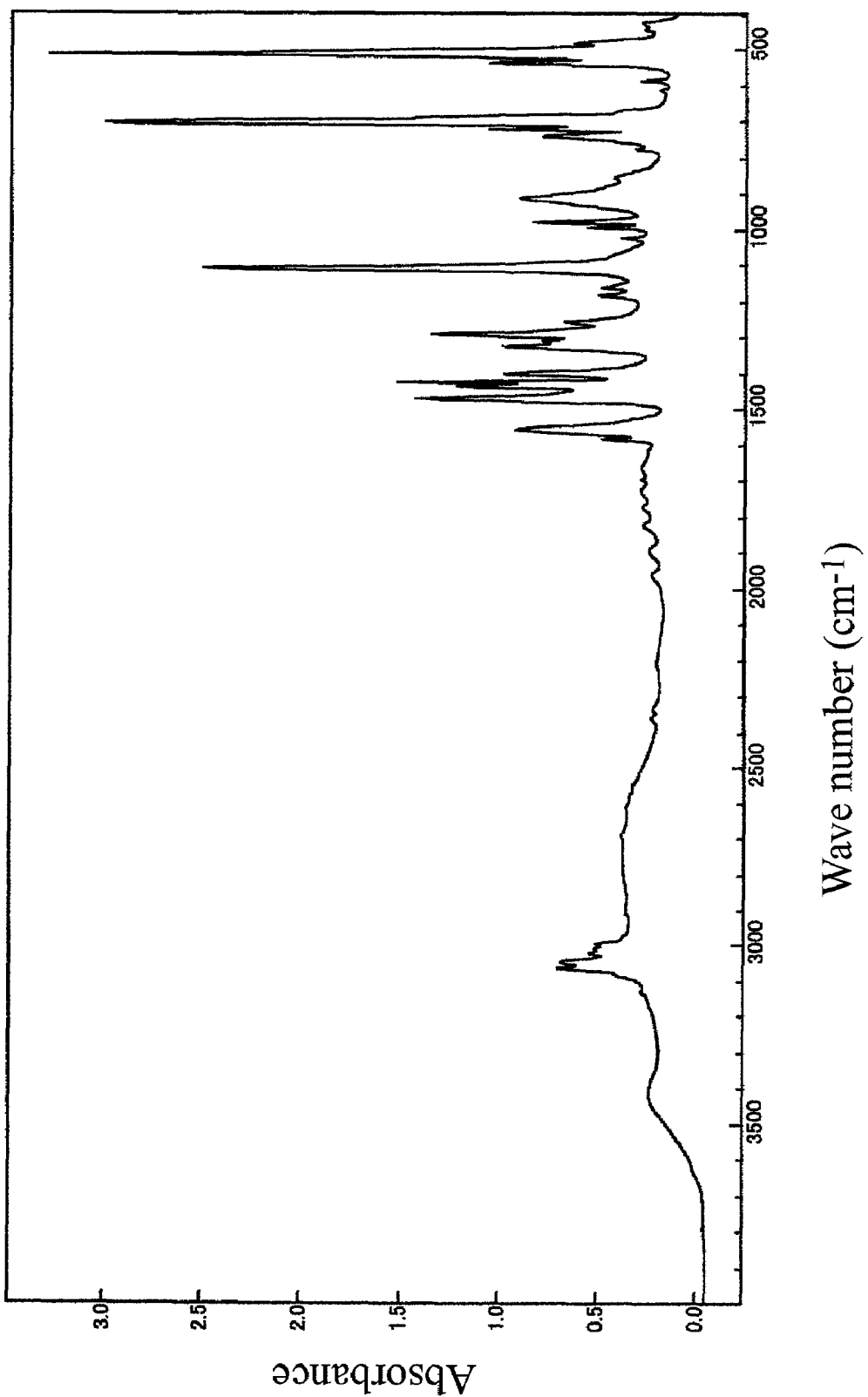
FIG. 9 is an IR spectrum of the compound 3 prepared as a curing accelerator according to the present invention.

$^1$H-NMR measurement, $^{31}$P-NMR measurement (conducted in heavy acetone), and IR measurement of the thus obtained product yielded the spectra shown in FIG. 7 through FIG. 9 respectively. Identification of each spectrum suggests that the product has a structure shown below in formula (XXII) (hereafter, referred to as "compound 3"). The yield was 84%.

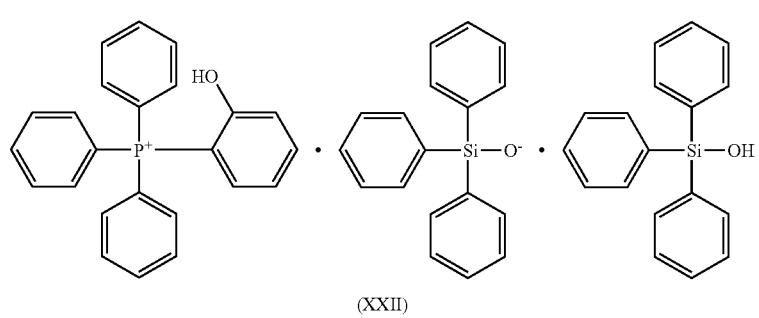

(XXII)

Synthesis Example 6

6.4 g (18.1 mmol) of 3-triphenylphosphoniophenolate was dispersed (and partially dissolved) in 60 ml of acetone, and 15.0 g (54.3 mmol) of triphenylsilanol was then added to the solution with constant stirring. As the triphenylsilanol was added, the solubility of the 3-triphenylphosphoniophenolate increased (the quantity of insoluble powder decreased), and a white powder then precipitated out almost immediately. The reaction mixture was stirred for 2 hours at room temperature, and the product was then filtered and dried, yielding 13.6 g of a white solid product.

Figure 10:
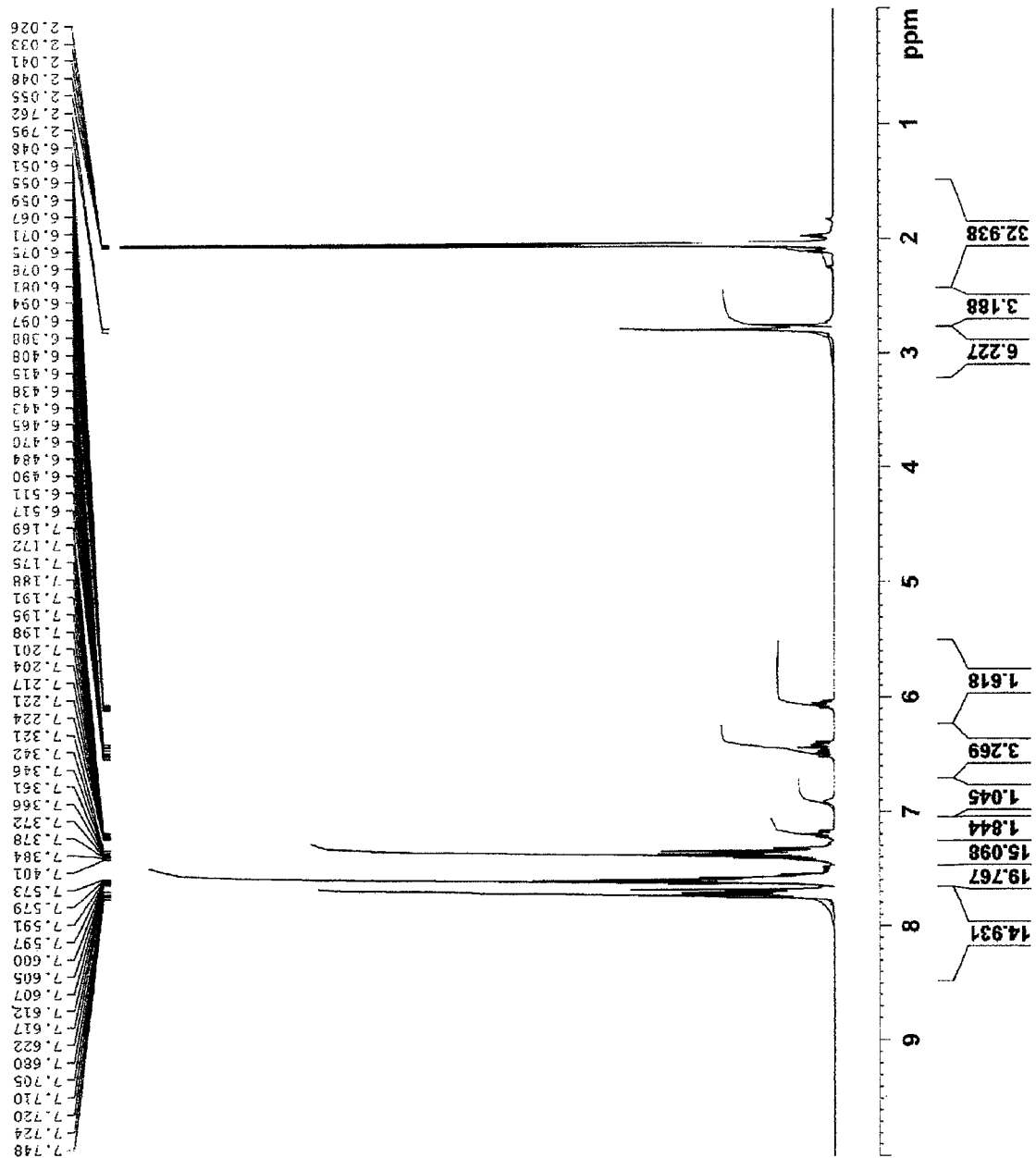
FIG. 10 is a $^1$H-NMR spectrum of a compound 4 prepared as a curing accelerator according to the present invention.
Figure 11:
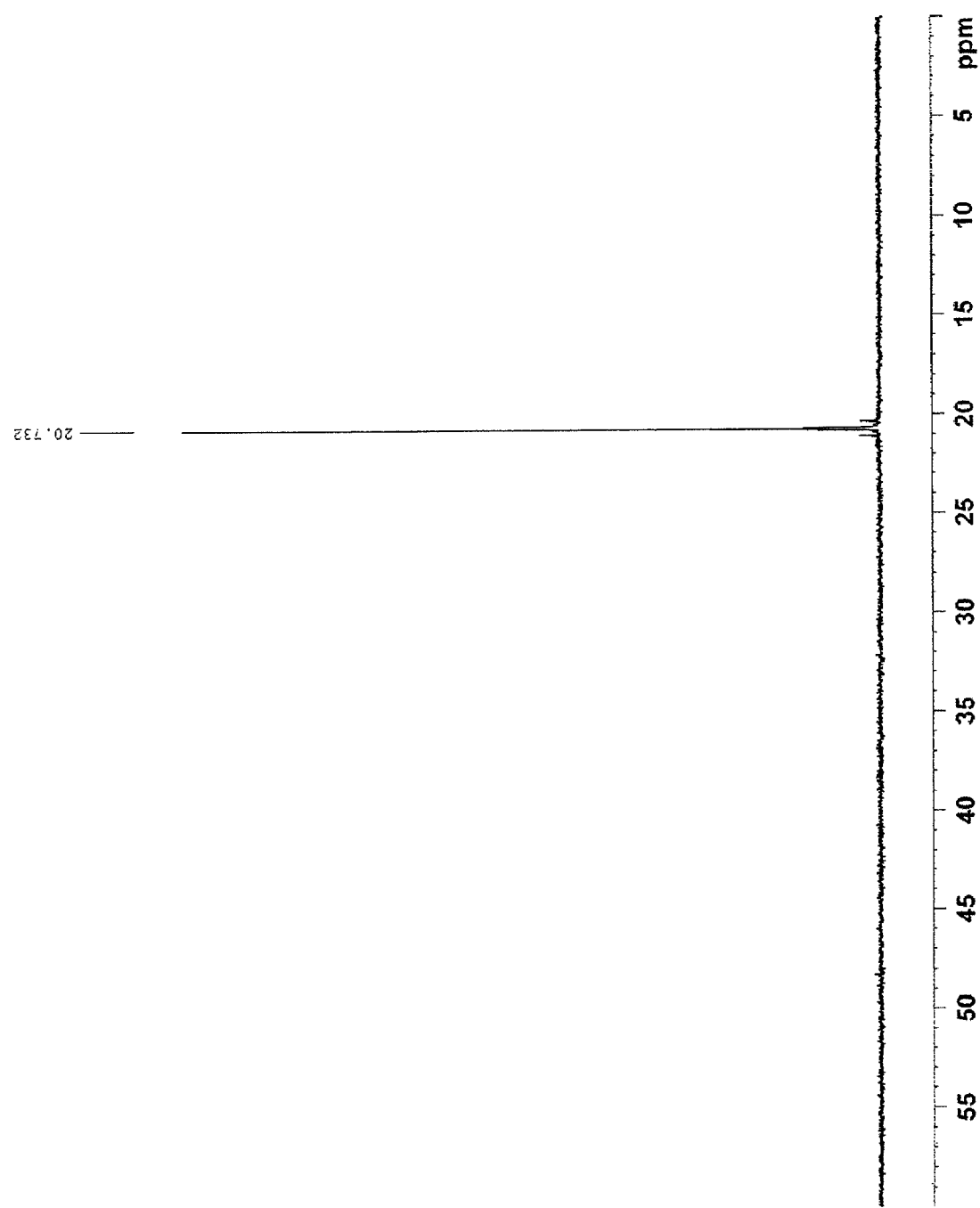
FIG. 11 is a $^{31}$P-NMR spectrum of the compound 4 prepared as a curing accelerator according to the present invention.
Figure 12:
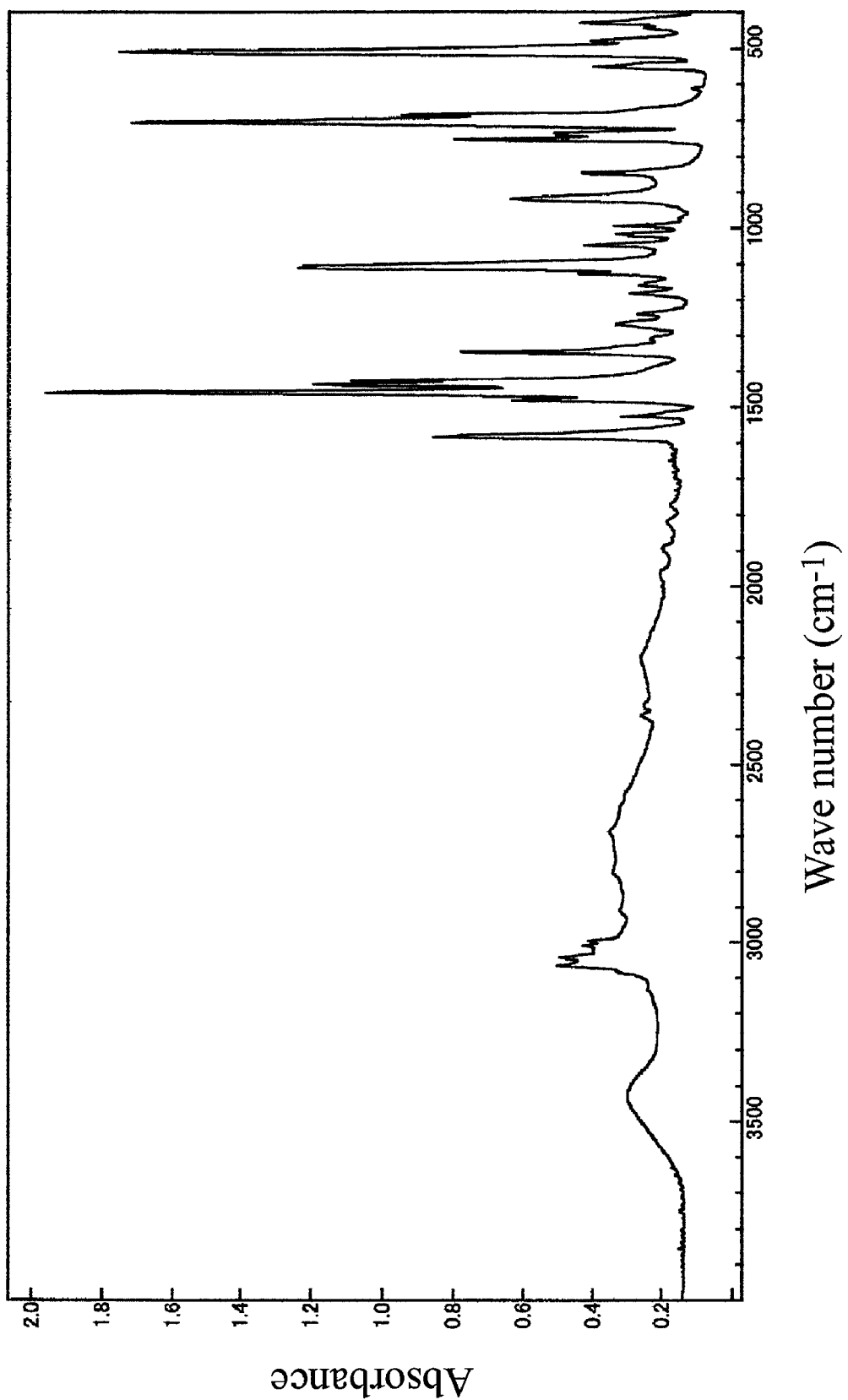
FIG. 12 is an IR spectrum of the compound 4 prepared as a curing accelerator according to the present invention.

$^1$H-NMR measurement, $^{31}$P-NMR measurement (conducted in heavy methanol), and IR measurement of the thus obtained product yielded the spectra shown in FIG. 10 through FIG. 12 respectively. Identification of each spectrum suggests that the product has a structure shown below in formula (XXIII) (hereafter, referred to as "compound 4"). The yield was 83%.

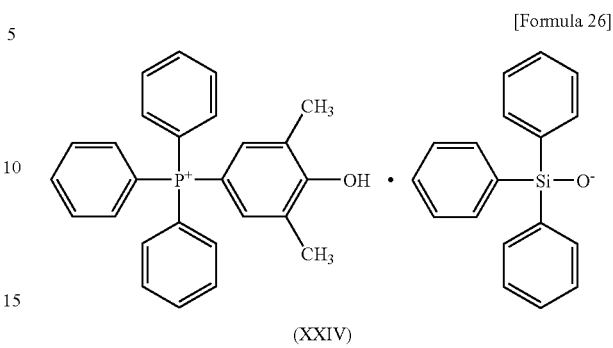

[Formula 26]

(XXIV)

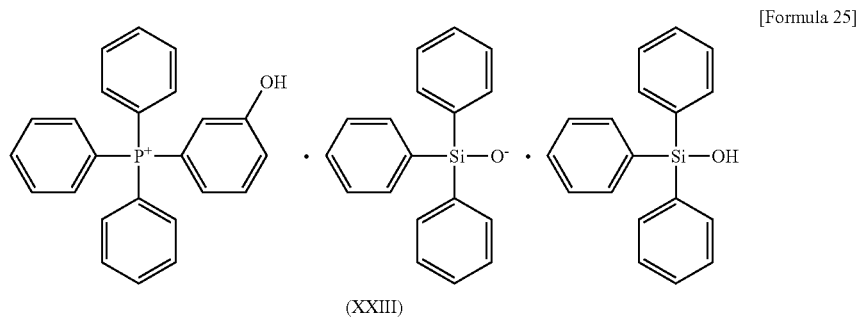

[Formula 25]

(XXIII)

Synthesis Example 7

6.9 g (18.1 mmol) of 2,6-dimethyl-4-triphenylphosphoniophenolate was dissolved in 30 ml of acetone and 7.5 ml of distilled water, and 15.0 g (54.3 mmol) of triphenylsilanol was then added to the solution with constant stirring. As the triphenylsilanol was added, a white powder gradually precipitated out. The reaction mixture was stirred for 2 hours at room temperature, and the product was then filtered and dried, yielding 9.8 g of a white solid product.

Figure 13:
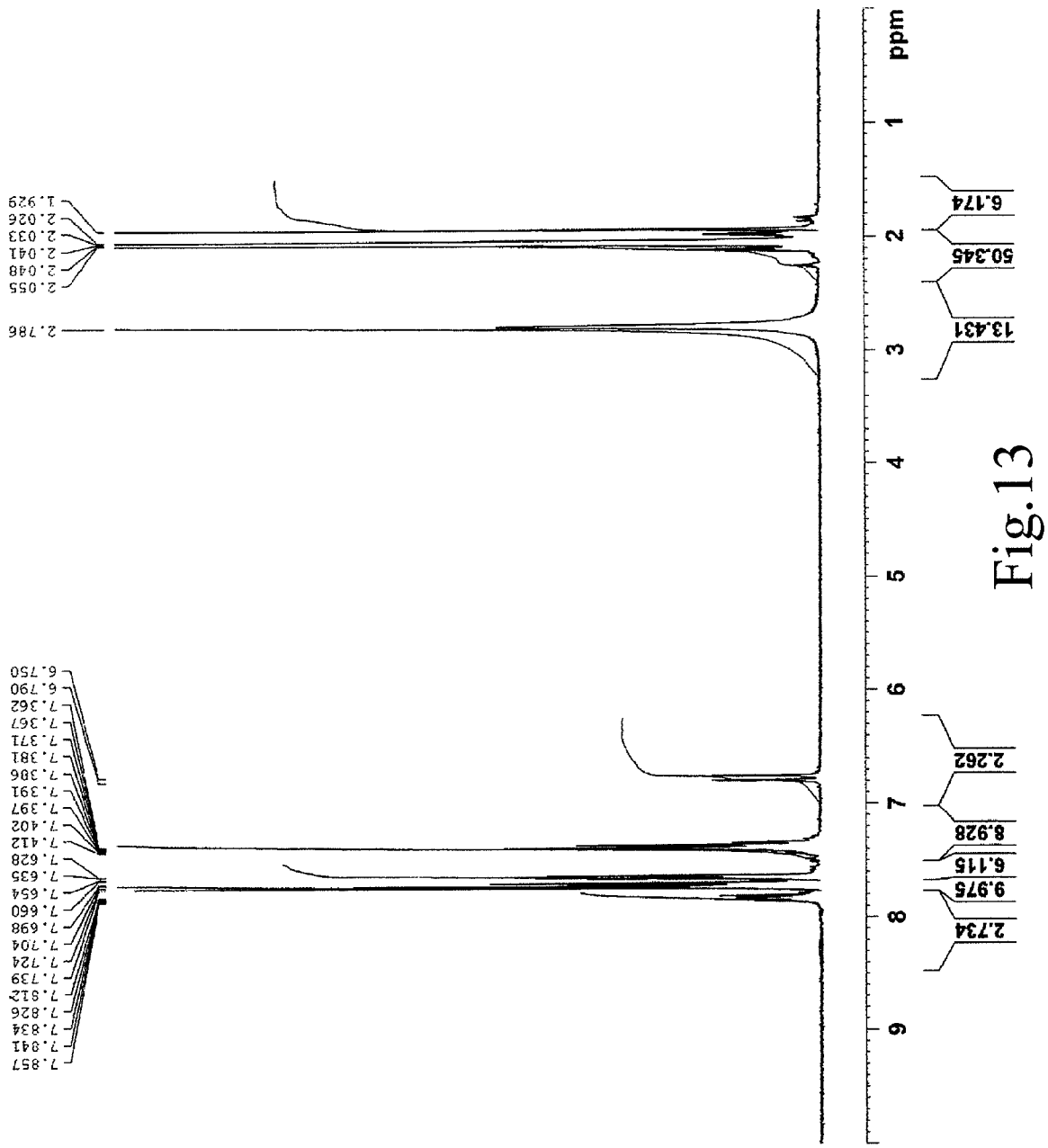
FIG. 13 is a $^1$H-NMR spectrum of a compound 5 prepared as a curing accelerator according to the present invention.
Figure 14:
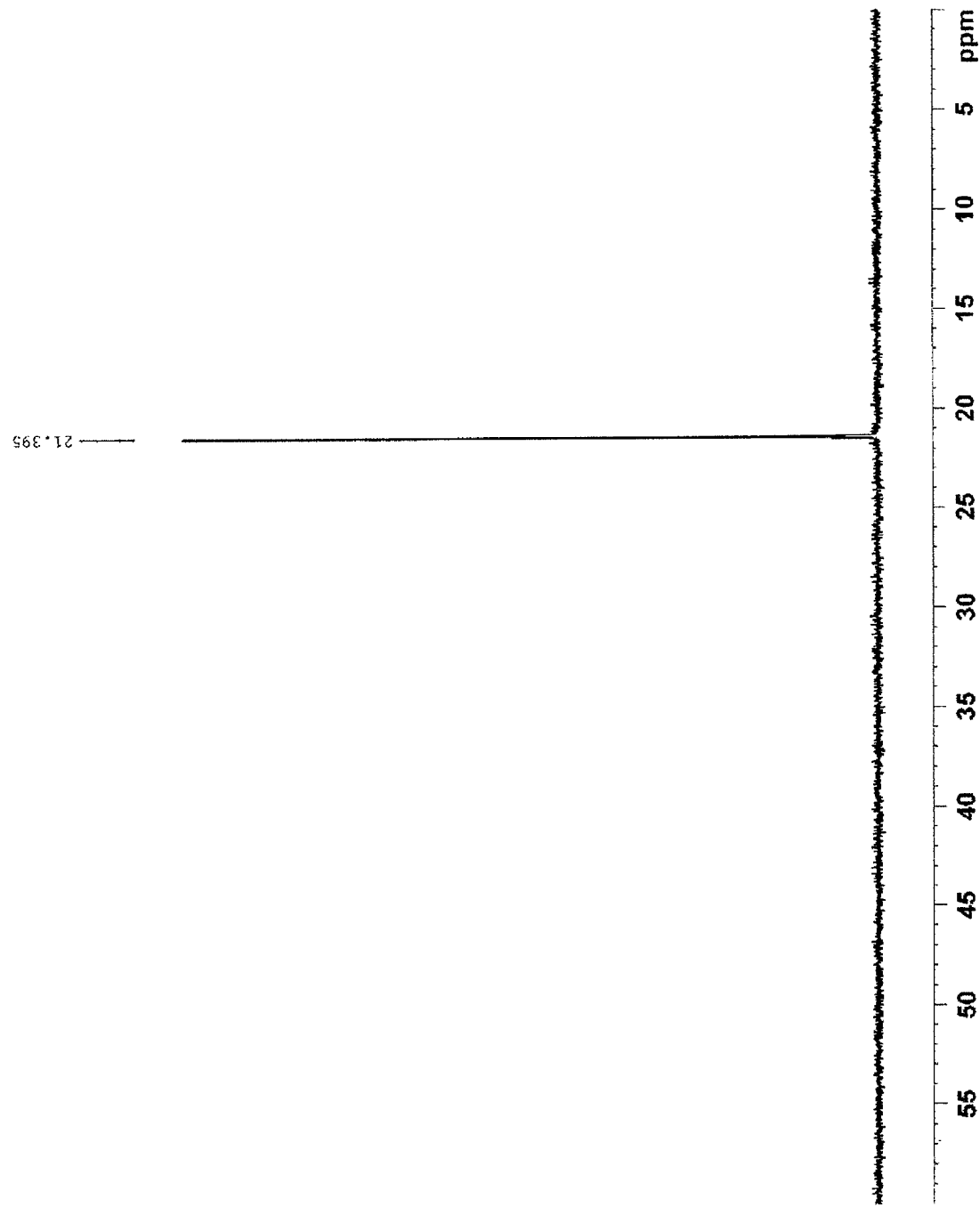
FIG. 14 is a $^{31}$P-NMR spectrum of the compound 5 prepared as a curing accelerator according to the present invention.
Figure 15:
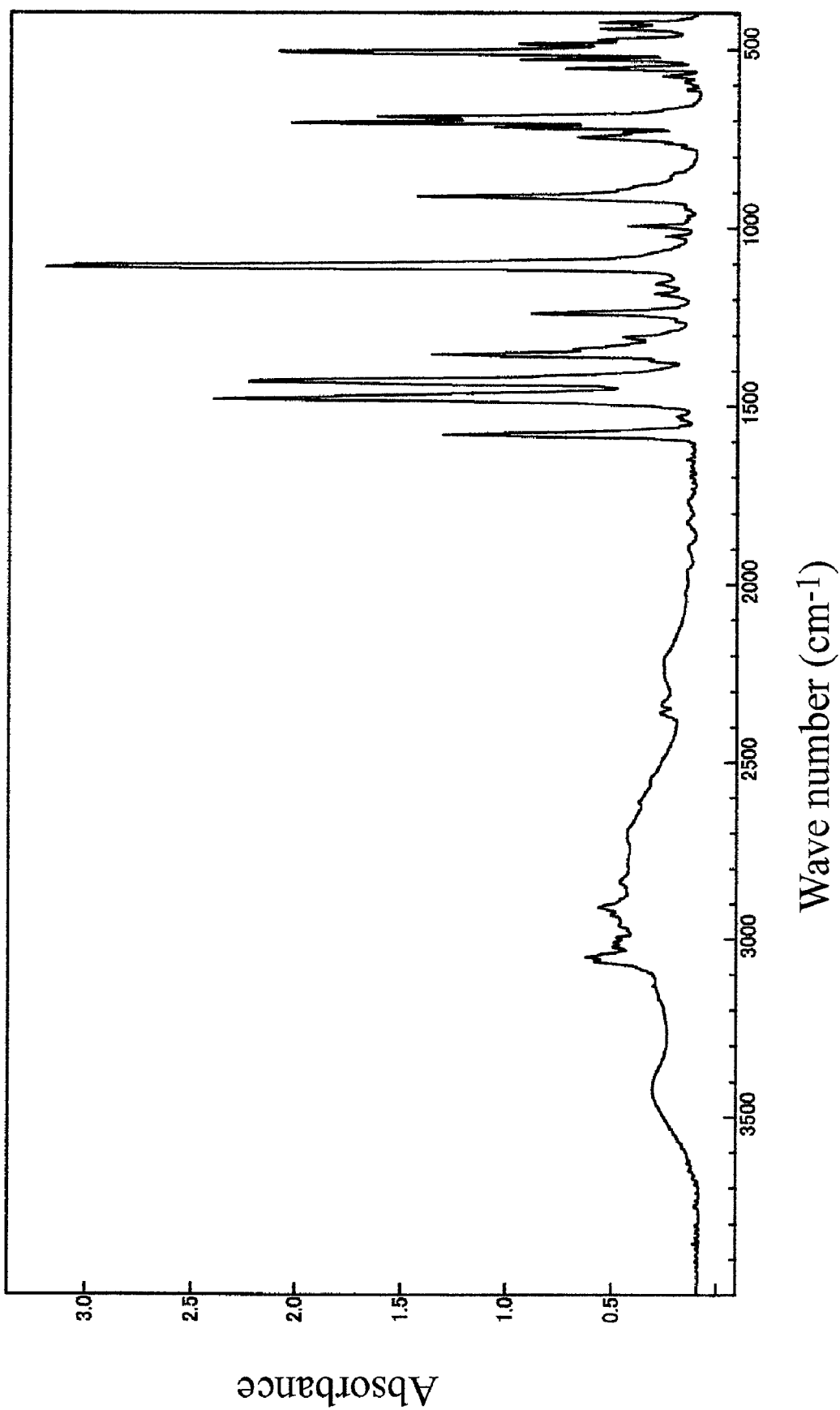
FIG. 15 is an IR spectrum of the compound 5 prepared as a curing accelerator according to the present invention.

$^1$H-NMR measurement, $^{31}$P-NMR measurement (conducted in heavy methanol), and IR measurement of the thus obtained product yielded the spectra shown in FIG. 13 through FIG. 15 respectively. Identification of each spectrum suggests that the product has a structure shown below in formula (XXIV) (hereafter, referred to as "compound 5"). The yield was 82%.

Synthesis Example 8

7.2 g (18.1 mmol) of 3-tri-p-tolylphosphoniophenolate was dispersed (and partially dissolved) in 50 ml of acetone, and 15.0 g (54.3 mmol) of triphenylsilanol was then added to the solution with constant stirring. As the triphenylsilanol was added, the solubility of the 3-tri-p-tolylphosphoniophenolate increased (the quantity of insoluble powder decreased), and a white powder then precipitated out almost immediately. The reaction mixture was stirred for 2 hours at room temperature, and the product was then filtered and dried, yielding 15.8 g of a white solid product.

Figure 16:
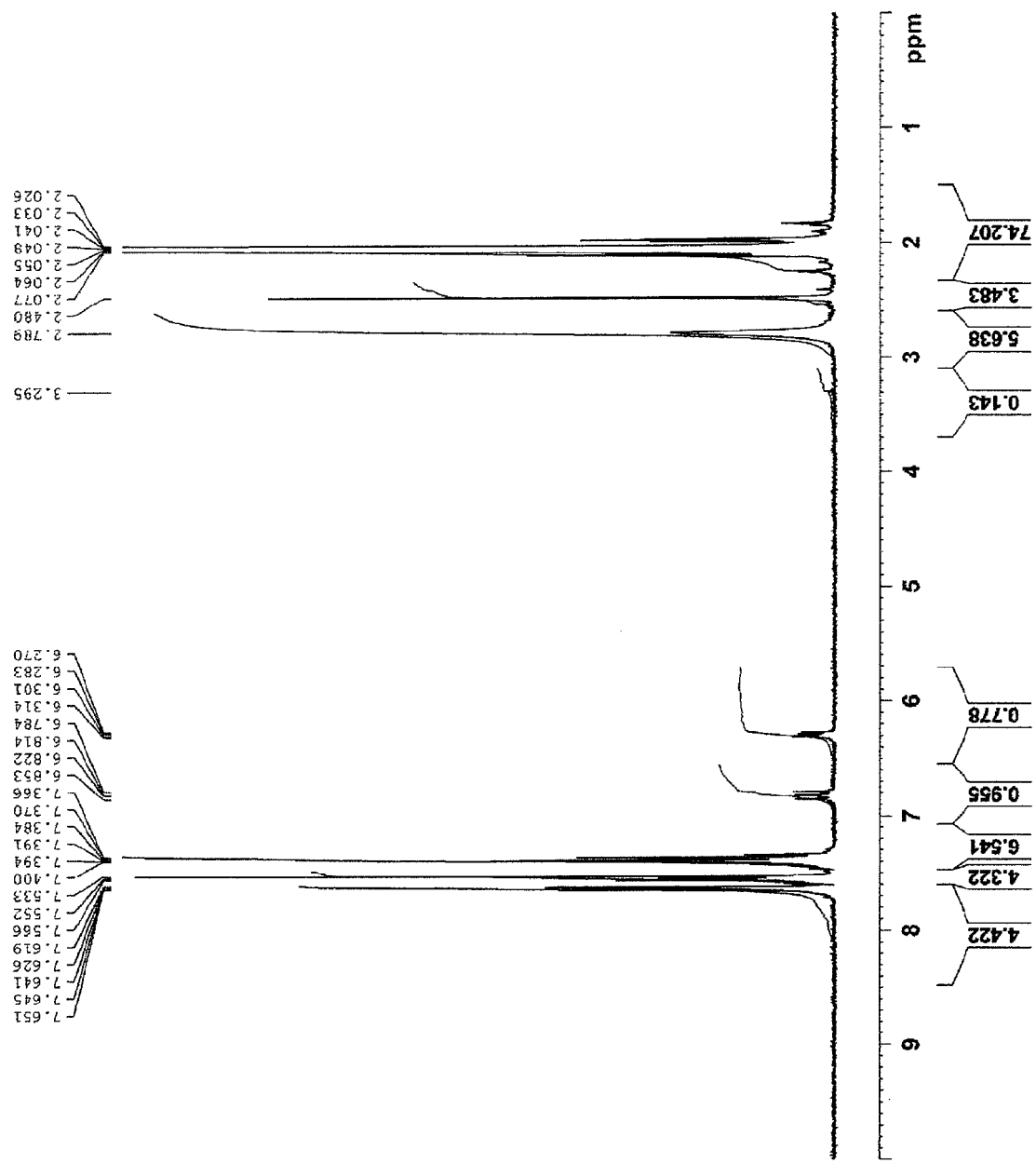
FIG. 16 is a $^1$H-NMR spectrum of a compound 6 prepared as a curing accelerator according to the present invention.
Figure 17:
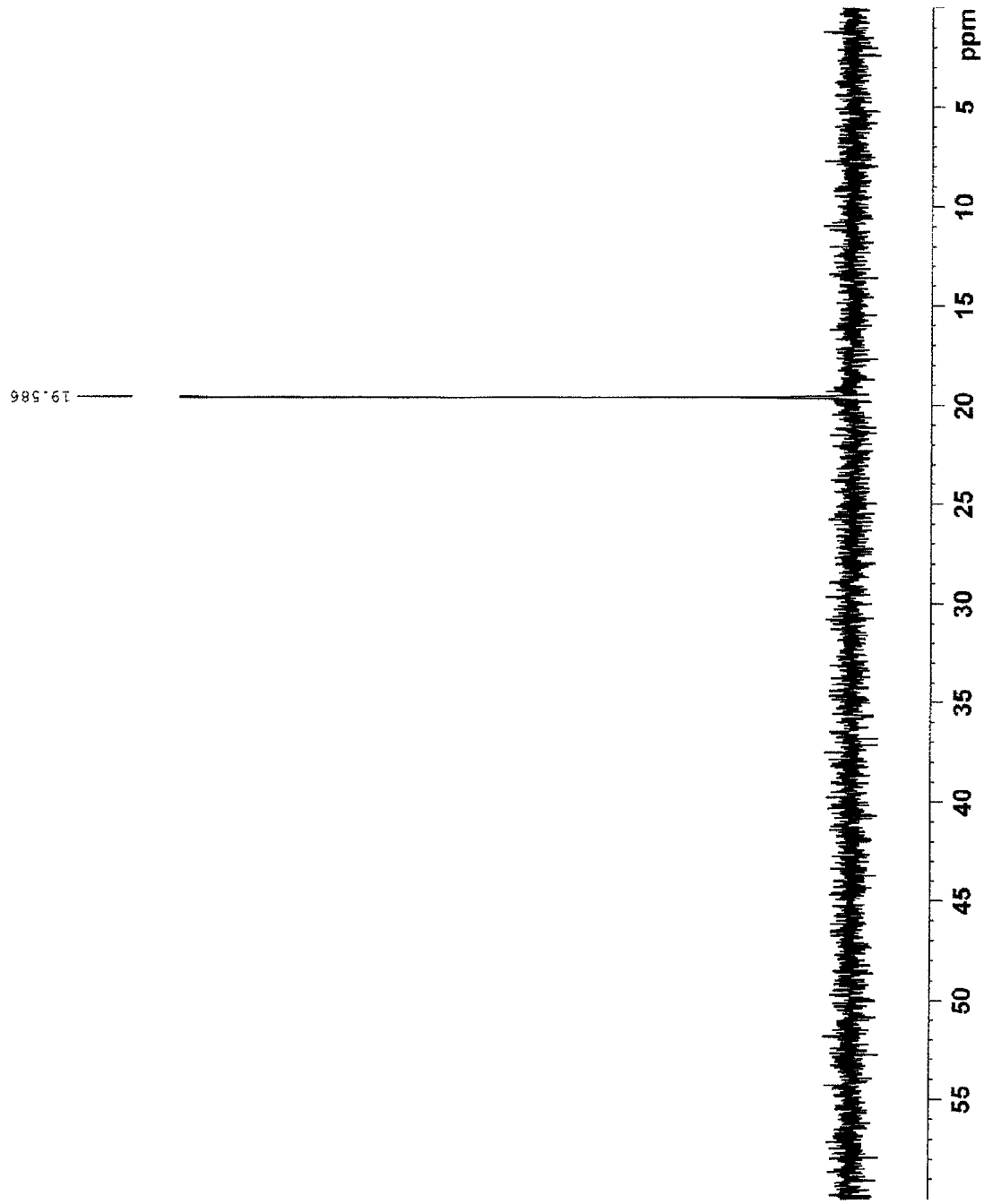
FIG. 17 is a $^{31}$P-NMR spectrum of the compound 6 prepared as a curing accelerator according to the present invention.
Figure 18:
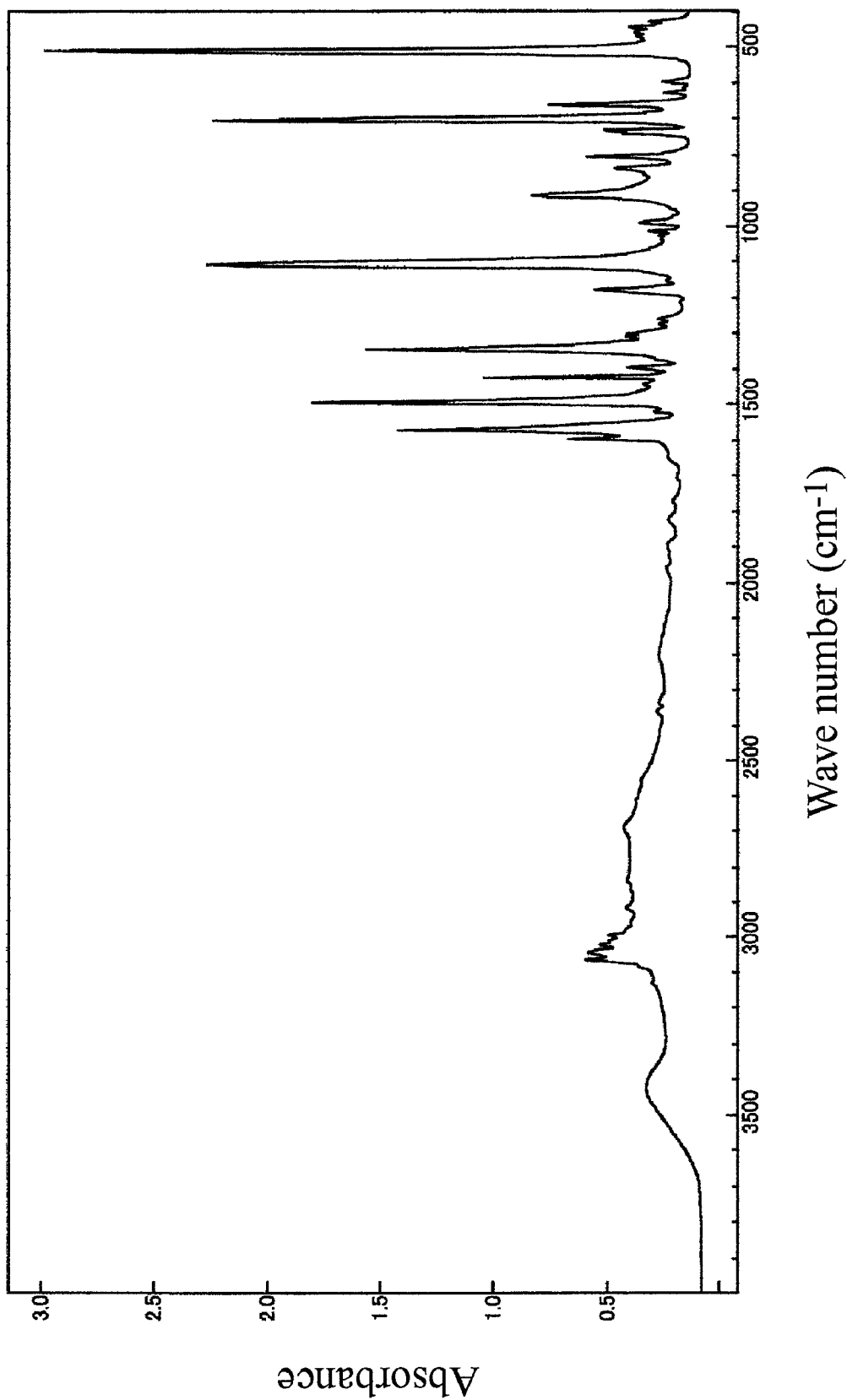
FIG. 18 is an IR spectrum of the compound 6 prepared as a curing accelerator according to the present invention.

$^1$H-NMR measurement, $^{31}$P-NMR measurement (conducted in heavy acetone), and IR measurement of the thus obtained product yielded the spectra shown in FIG. 16 through FIG. 18 respectively. Identification of each spectrum suggests that the product has a structure shown below in formula (XXV) (hereafter, referred to as "compound 6"). The yield was 92%.

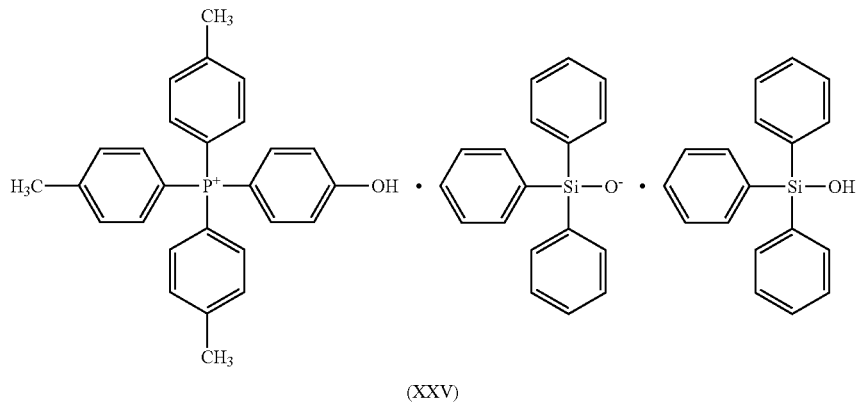

(XXV)

Synthesis Example 9

6.6 g (18.1 mmol) of cyclohexyldiphenylphosphoniophenolate was dispersed (and partially dissolved) in 30 ml of acetone, and 15.0 g (54.3 mmol) of triphenylsilanol was then added to the solution with constant stirring. When the triphenylsilanol was added, it initially dissolved. Subsequently, 60 ml of hexane was added, and a white powder gradually precipitated out. The reaction mixture was stirred for approximately 6 hours following addition of the hexane, and the product was then filtered and dried, yielding 9.1 g of a white solid product.

Figure 19:
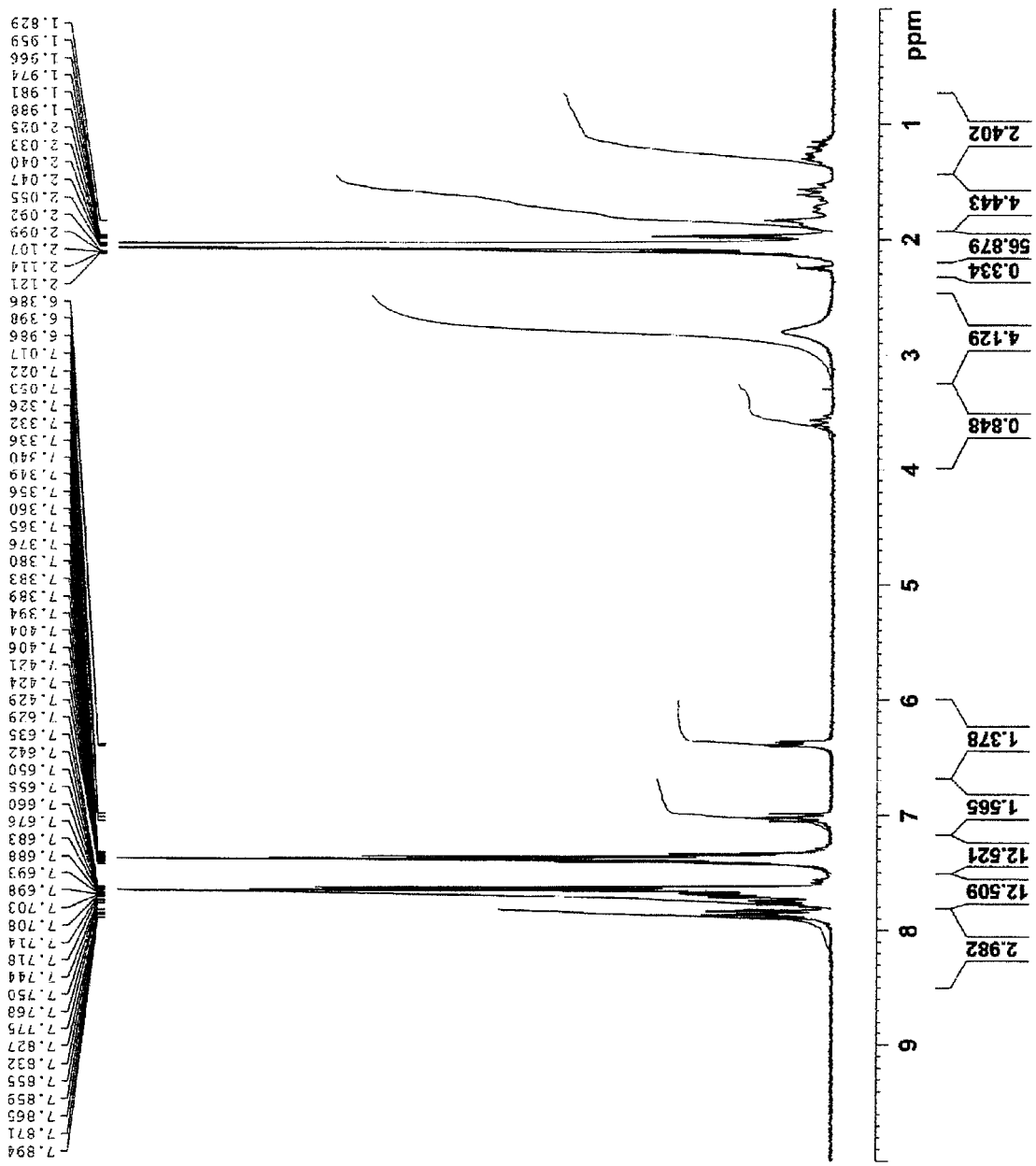
FIG. 19 is a $^1$H-NMR spectrum of a compound 7 prepared as a curing accelerator according to the present invention.
Figure 20:
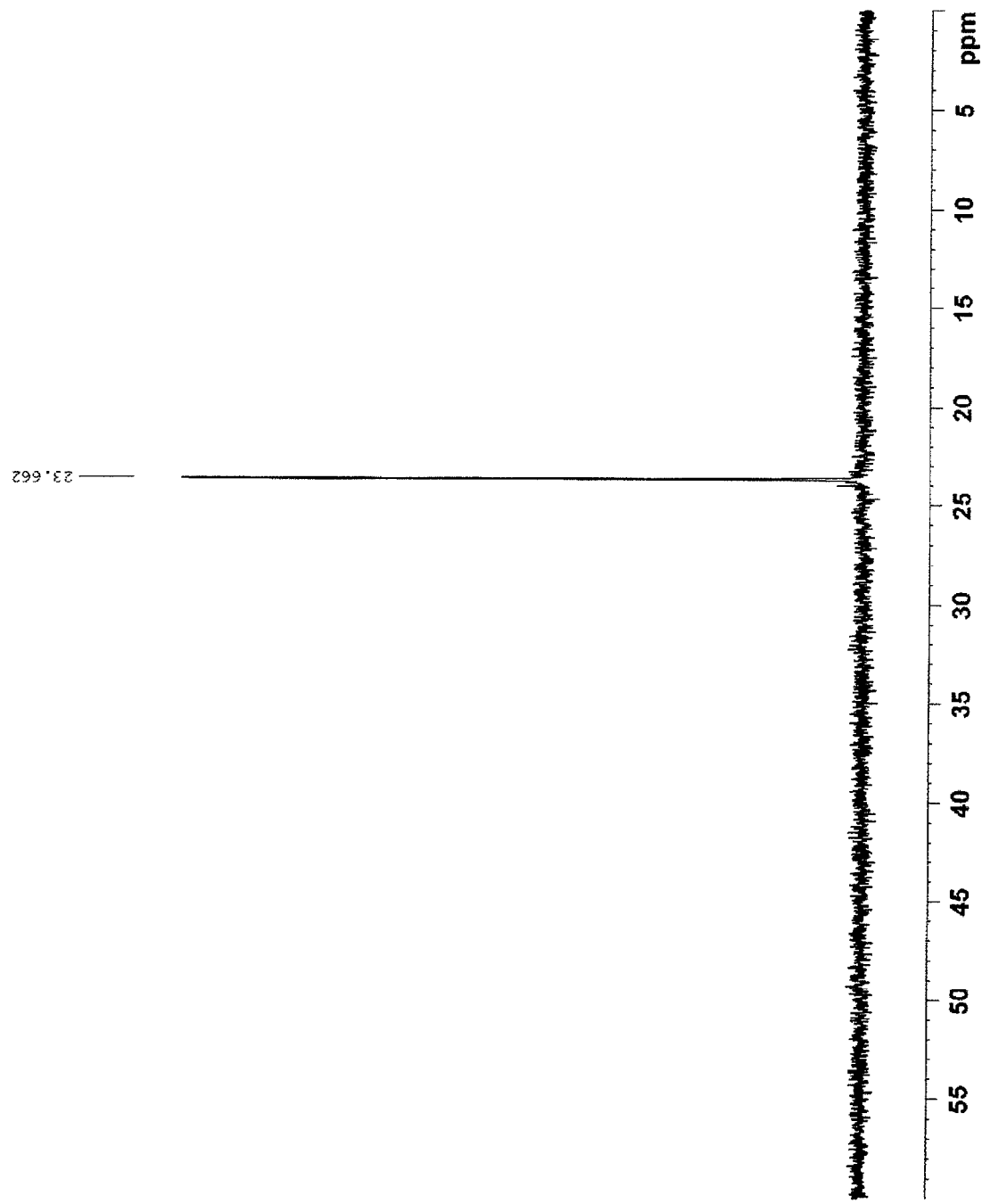
FIG. 20 is a $^{31}$P-NMR spectrum of the compound 7 prepared as a curing accelerator according to the present invention.
Figure 21:
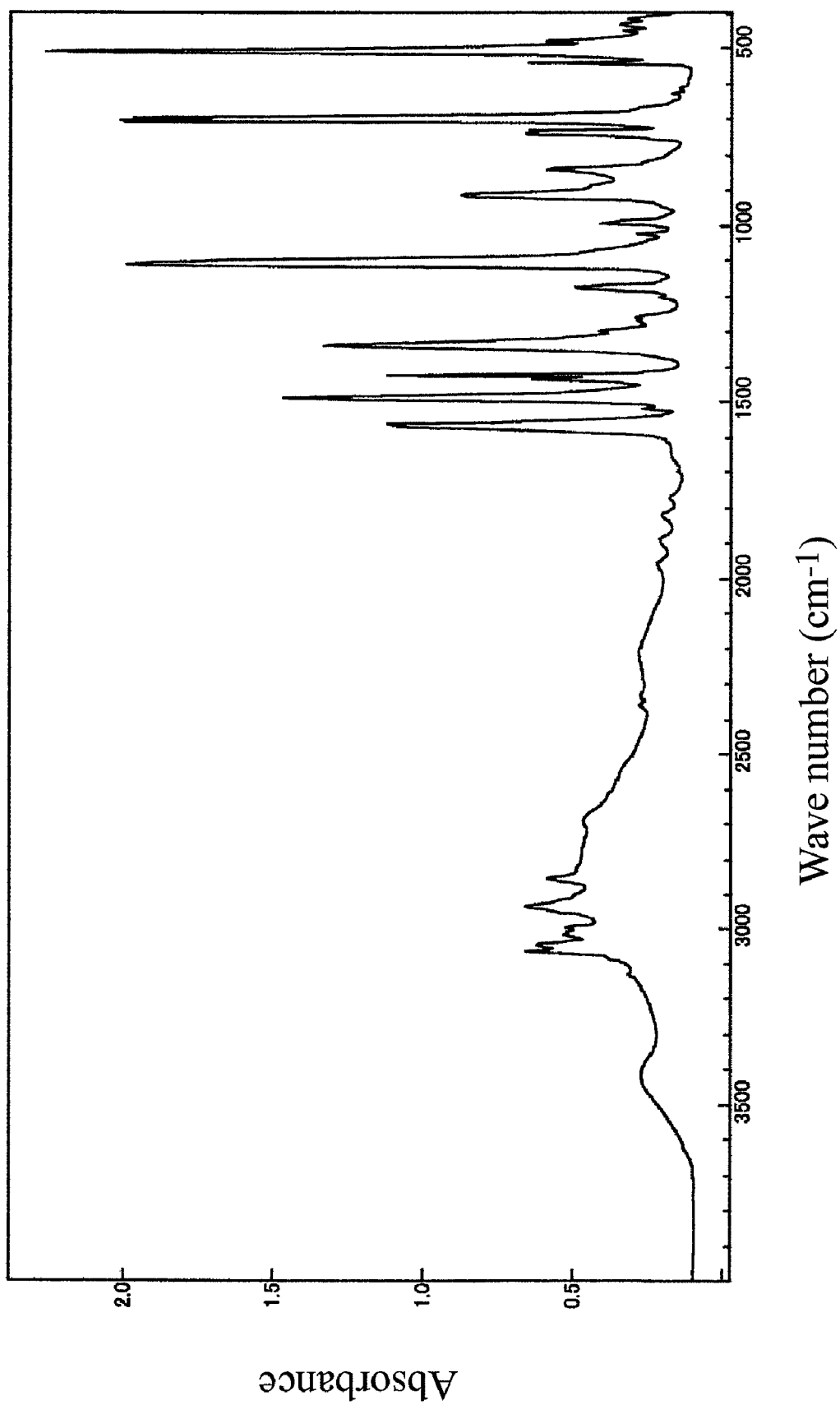
FIG. 21 is an IR spectrum of the compound 7 prepared as a curing accelerator according to the present invention.

$^1$H-NMR measurement, $^{31}$P-NMR measurement (conducted in heavy acetone), and IR measurement of the thus obtained product yielded the spectra shown in FIG. 19 through FIG. 21 respectively. Identification of each spectrum suggests that the product has a structure shown below in formula (XXVI) (hereafter, referred to as "compound 7"). The yield was 55%.

(product name: YX-4000H, manufactured by Japan Epoxy Resins Co., Ltd.)

Epoxy resin 2: a diphenylmethane backbone epoxy resin with an epoxy equivalent weight of 192, and a melting point of 79° C. (product name: YSLV-80XY, manufactured by Nippon Steel Chemical Group)

Epoxy resin with a flame retardant action (a brominated epoxy resin): a brominated bisphenol A epoxy resin with an epoxy equivalent weight of 393, a softening point of 80° C., and a bromine content of 48% by weight (Curing Agents)

Curing agent 1: a phenol aralkyl resin with a hydroxyl group equivalent weight of 176, and a softening point of 70° C. (product name: Mirex XL-225, manufactured by Mitsui Chemicals, Inc.)

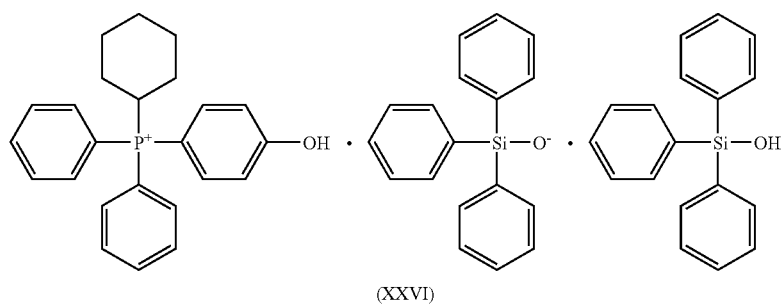

(XXVI)

[Preparation and Evaluation of the Properties of Curable Resin Compositions]

Examples 1 to 14

Comparative Examples 1 to 10

The following materials were used in the examples.

(Epoxy Resins)

Epoxy resin 1: a biphenyl epoxy resin with an epoxy equivalent weight of 196, and a melting point of 106° C.

Curing agent 2: a biphenyl backbone phenolic resin with a hydroxyl group equivalent weight of 199, and a softening point of 89° C. (product name: MEH-7851, manufactured by Meiwa Plastic Industries, Ltd.)

(Curing Accelerators)

Curing accelerator 1: the compound 1 prepared in the synthesis example 1 or 2

Curing accelerator 2: the compound 2 prepared in the synthesis example 3 or 4

Curing accelerator 3: the compound 3 prepared in the synthesis example 5

Curing accelerator 4: the compound 4 prepared in the synthesis example 6
Curing accelerator 5: the compound 5 prepared in the synthesis example 7
Curing accelerator 6: the compound 6 prepared in the synthesis example 8
Curing accelerator 7: the compound 7 prepared in the synthesis example 9
Curing accelerator A: triphenylphosphine (a comparative curing accelerator)
Curing accelerator B: the addition reaction product of triphenylphosphine and 1,4-benzoquinone
Curing accelerator C: 4-triphenylphosphoniophenolate
Curing accelerator D: 2-triphenylphosphoniophenolate
Additive 1: diphenylsilanediol
Additive 2: triphenylsilanol The additives 1 and 2, which correspond with precursors to the curing accelerators according to the present invention, and the curing accelerators A to D were both used for the purposes of comparison.

Inorganic filler: Spherical fused silica with an average particle size of 17.5 μm and a specific surface area of 3.8 $m^2/g$ Coupling agent: an epoxysilane (γ-glycidoxypropyltrimethoxysilane)

Colorant: carbon black (product name: MA-100, manufactured by Mitsubishi Chemical Corporation)

Release agent: carnauba wax (manufactured by Cerarica Noda Co., Ltd.)

Flame retardant: Antimony trioxide

The components listed above were combined using the parts by weight shown in Table 1 and Table 2, and were then subjected to roller kneading under conditions including a kneading temperature of 80° C. and a kneading time of 15 minutes, thus yielding curable resin compositions of the examples 1 to 14 and the comparative examples 1 to 10.

[Table 1]

TABLE 1

Blend Composition Table

| Blend Material | Example 1 | Example 2 | Example 3 | Example 4 | Comparative example 1 | 2 | 3 | 4 | 5 | 6 | 7 | 8 | 9 | 10 |
|---|---|---|---|---|---|---|---|---|---|---|---|---|---|---|
| Epoxy resin 1 | 85 | 85 | | | 85 | 85 | 85 | 85 | 85 | | | | | |
| Epoxy resin 2 | | | 100 | 100 | | | | | | 100 | 100 | 100 | 100 | 100 |
| Brominated epoxy resin | 15 | 15 | | | 15 | 15 | 15 | 15 | 15 | | | | | |
| Curing agent 1 | 83 | 83 | | | 83 | 83 | 83 | 83 | 83 | | | | | |
| Curing agent 2 | | | 104 | 104 | | | | | | 104 | 104 | 104 | 104 | 104 |
| Curing accelerator 1 | 3.7 | | 4.8 | | | | | | | | | | | |
| Curing accelerator 2 | | 5.9 | | 7.7 | | | | | | | | | | |
| Curing accelerator A | | | | | 2.4 | | | | | 3.1 | | | | |
| Curing accelerator B | | | | | | 3.4 | | | | | 4.4 | | | |
| Curing accelerator C | | | | | | | 2.3 | 2.3 | 2.3 | | | 3.0 | 3.0 | 3.0 |
| Additive 1 | | | | | | | | 1.4 | | | | | 1.8 | |
| Additive 2 | | | | | | | | | 3.5 | | | | | 4.7 |
| Carnauba wax | 1 | 1 | 1 | 1 | 1 | 1 | 1 | 1 | 1 | 1 | 1 | 1 | 1 | 1 |
| Antimony trioxide | 6 | 6 | 6 | 6 | 6 | 6 | 6 | 6 | 6 | 6 | 6 | 6 | 6 | 6 |
| Carbon black | 2.6 | 2.6 | 2.6 | 2.6 | 2.6 | 2.6 | 2.6 | 2.6 | 2.6 | 2.6 | 2.6 | 2.6 | 2.6 | 2.6 |
| Epoxysilane | 11 | 11 | 11 | 11 | 11 | 11 | 11 | 11 | 11 | 11 | 11 | 11 | 11 | 11 |
| Fused silica | 1521 | 1537 | 2061 | 2088 | 1511 | 1518 | 1510 | 1521 | 1536 | 2046 | 2058 | 2045 | 2061 | 2088 |
| Fused silica (weight %) | 88 | 88 | 90 | 90 | 88 | 88 | 88 | 88 | 88 | 90 | 90 | 90 | 90 | 90 |
| Fused silica (volume %) | 80 | 80 | 83 | 83 | 80 | 80 | 80 | 80 | 80 | 83 | 83 | 83 | 83 | 83 |

[Table 2]

TABLE 2

Blend Composition Table

| Blend Material | Example 5 | 6 | 7 | 8 | 9 | 10 | 11 | 12 | 13 | 14 |
|---|---|---|---|---|---|---|---|---|---|---|
| Epoxy resin 1 | 85 | 85 | 85 | 85 | 85 | | | | | |
| Epoxy resin 2 | | | | | | 100 | 100 | 100 | 100 | 100 |
| Brominated epoxy resin | 15 | 15 | 15 | 15 | 15 | | | | | |
| Curing agent 1 | 83 | 83 | 83 | 83 | 83 | | | | | |
| Curing agent 2 | | | | | | 104 | 104 | 104 | 104 | 104 |
| Curing accelerator 3 | 5.9 | | | | | 7.7 | | | | |

TABLE 2-continued

Blend Composition Table

| | Example | | | | | | | | | |
|---|---|---|---|---|---|---|---|---|---|---|
| Blend Material | 5 | 6 | 7 | 8 | 9 | 10 | 11 | 12 | 13 | 14 |
| Curing accelerator 4 | | 5.9 | | | | | 7.7 | | | |
| Curing accelerator 5 | | | 6.1 | | | | | 7.9 | | |
| Curing accelerator 6 | | | | 4.4 | | | | | 5.7 | |
| Curing accelerator 7 | | | | | 6.0 | | | | | 7.8 |
| Carnauba wax | 1 | 1 | 1 | 1 | 1 | 1 | 1 | 1 | 1 | 1 |
| Antimony trioxide | 6 | 6 | 6 | 6 | 6 | 6 | 6 | 6 | 6 | 6 |
| Carbon black | 2.6 | 2.6 | 2.6 | 2.6 | 2.6 | 2.6 | 2.6 | 2.6 | 2.6 | 2.6 |
| Epoxysilane | 11 | 11 | 11 | 11 | 11 | 11 | 11 | 11 | 11 | 11 |
| Fused silica | 1537 | 1537 | 1538 | 1526 | 1537 | 2088 | 2088 | 2090 | 2070 | 2088 |
| Fused silica (weight %) | 88 | 88 | 88 | 88 | 88 | 90 | 90 | 90 | 90 | 90 |
| Fused silica (volume %) | 80 | 80 | 80 | 80 | 80 | 83 | 83 | 83 | 83 | 83 |

Next, the curable resin compositions obtained in the examples 1 to 14 and the comparative examples 1 to 10 were each evaluated using the various tests described below. The results of the evaluations are shown in Table 3 and Table 4. Molding of each curable resin composition was conducted using a transfer molding apparatus, under conditions including a die temperature of 180° C., a molding pressure of 6.9 MPa, and a curing time of 90 seconds. Furthermore, post-curing was conducted for 6 hours at 175° C.

(1) Spiral Flow (an Indicator of Fluidity)

Using a molding die for measuring spiral flow as prescribed in EMMI-1-66, the curable resin composition was molded under the conditions described above and the flow distance (cm) was measured.

(2) Hot Hardness

The curable resin composition was molded under the conditions described above on the top of a circular plate with a diameter of 50 mm and a thickness of 3 mm, and the hardness was measured immediately following molding using a Shore D hardness meter.

(3) Hot Hardness upon Moisture Absorption

The curable resin composition was left to stand for 72 hours at 25° C. and 50% RH, and the hardness was then measured using a Shore D hardness meter under the same conditions as (2) above.

(4) Reflow Crack Resistance 1

Using silver paste, a test silicon chip of dimensions 8×10× 0.4 mm was mounted on a 42-alloy frame. Using the curable resin composition, molding and post-curing were then conducted under the conditions described above, yielding a QFP 80-pin package with external dimensions of 14×20×2.0 mm. The thus prepared package was subjected to moisture absorption for 168 hours under conditions of 30° C. and 85% RH, reflow treatment was conducted for 90 seconds at 215° C. using a vapor phase reflow apparatus, and the package was checked for the presence of cracks, with the reflow crack resistance being recorded as the number of packages in which cracks occurred relative to the number of packages tested (5).

(5) Reflow Crack Resistance 2

With the exception of subjecting the prepared package to moisture absorption for 168 hours under conditions of 85° C. and 60% RH, evaluation was conducted under the same conditions as (4) above.

(6) Reflow Crack Resistance 3

With the exception of subjecting the prepared package to moisture absorption for 168 hours under conditions of 85° C. and 85% RH, evaluation was conducted under the same conditions as (4) above.

(7) High-temperature Storage Properties

An element comprising aluminum wiring with a line/space pattern of 10 μm formed on top of a silicon substrate having a 5 μm oxide film and with an external size of 5×9 mm was used as a test element. Using silver paste, this test element was mounted to a 16-pin DIP (Dual Inline Package) 42-alloy lead frame that had undergone partial silver plating. Subsequently, using thermonic wire, the bonding pads of the element and the inner leads were connected with Au lines at 200° C. Using the curable resin composition, molding and post-curing were then conducted under the conditions described above, yielding a package. Packages prepared in this manner were stored at 200° C. for 500 hours or 1,000 hours, were subsequently removed and subjected to a continuity test, and the number of faulty packages was determined, with the high-temperature storage property being reported as the number of packages in which faults occurred relative to the number of packages tested (10).

[Table 3]

TABLE 3

| | Evaluation Results | | | | | | | | | | | | | |
|---|---|---|---|---|---|---|---|---|---|---|---|---|---|---|
| | Example | | | | Comparative example | | | | | | | | | |
| Evaluation Item | 1 | 2 | 3 | 4 | 1 | 2 | 3 | 4 | 5 | 6 | 7 | 8 | 9 | 10 |
| Spiral flow | 126 | 124 | 101 | 100 | 74 | 100 | 110 | 118 | 116 | 55 | 75 | 85 | 92 | 90 |
| Hot hardness | 83 | 83 | 81 | 81 | 80 | 79 | 83 | 83 | 83 | 76 | 75 | 81 | 81 | 81 |
| Hot hardness upon moisture absorption | 82 | 82 | 79 | 79 | 66 | 63 | 82 | 82 | 82 | 56 | 53 | 79 | 79 | 79 |

TABLE 3-continued

| | Evaluation Results | | | | | | | | | | | | | |
|---|---|---|---|---|---|---|---|---|---|---|---|---|---|---|
| | Example | | | | Comparative example | | | | | | | | | |
| Evaluation Item | 1 | 2 | 3 | 4 | 1 | 2 | 3 | 4 | 5 | 6 | 7 | 8 | 9 | 10 |
| Reflow crack resistance 1 | 0/5 | 0/5 | 0/5 | 0/5 | 0/5 | 0/5 | 0/5 | 0/5 | 0/5 | 0/5 | 0/5 | 0/5 | 0/5 | 0/5 |
| Reflow crack resistance 2 | 0/5 | 0/5 | 0/5 | 0/5 | 0/5 | 0/5 | 0/5 | 0/5 | 0/5 | 0/5 | 0/5 | 0/5 | 0/5 | 0/5 |
| Reflow crack resistance 3 | 0/5 | 0/5 | 0/5 | 0/5 | 0/5 | 0/5 | 0/5 | 0/5 | 0/5 | 0/5 | 0/5 | 0/5 | 0/5 | 0/5 |
| High-temperature storage property | | | | | | | | | | | | | | |
| 500 h. | 0/10 | 0/10 | 0/10 | 0/10 | 0/10 | 0/10 | 0/10 | 0/10 | 0/10 | 0/10 | 0/10 | 0/10 | 0/10 | 0/10 |
| 1,000 h. | 0/10 | 0/10 | 0/10 | 0/10 | 0/10 | 0/10 | 0/10 | 0/10 | 0/10 | 0/10 | 0/10 | 0/10 | 0/10 | 0/10 |

[Table 4]

TABLE 4

| | Evaluation Results | | | | | | | | | |
|---|---|---|---|---|---|---|---|---|---|---|
| | Example | | | | | | | | | |
| Evaluation Item | 5 | 6 | 7 | 8 | 9 | 10 | 11 | 12 | 13 | 14 |
| Spiral flow | 125 | 123 | 121 | 126 | 124 | 102 | 100 | 101 | 97 | 101 |
| Hot hardness | 83 | 82 | 83 | 84 | 84 | 81 | 80 | 81 | 82 | 82 |
| Hot hardness upon moisture absorption | 82 | 81 | 82 | 83 | 83 | 79 | 78 | 79 | 80 | 80 |
| Reflow crack resistance 1 | 0/5 | 0/5 | 0/5 | 0/5 | 0/5 | 0/5 | 0/5 | 0/5 | 0/5 | 0/5 |
| Reflow crack resistance 2 | 0/5 | 0/5 | 0/5 | 0/5 | 0/5 | 0/5 | 0/5 | 0/5 | 0/5 | 0/5 |
| Reflow crack resistance 3 | 0/5 | 0/5 | 0/5 | 0/5 | 0/5 | 0/5 | 0/5 | 0/5 | 0/5 | 0/5 |
| High-temperature storage property | | | | | | | | | | |
| 500 h. | 0/10 | 0/10 | 0/10 | 0/10 | 0/10 | 0/10 | 0/10 | 0/10 | 0/10 | 0/10 |
| 1,000 h. | 0/10 | 0/10 | 0/10 | 0/10 | 0/10 | 0/10 | 0/10 | 0/10 | 0/10 | 0/10 |

As is evident from Table 3 and Table 4, the examples 1 to 14 comprising a curing accelerator according to the present invention all exhibited excellent results for fluidity, hot hardness, hot hardness upon moisture absorption, reflow crack resistance, and high-temperature storage properties.

In contrast, the comparative examples 1 to 10, which comprised curing accelerators different from the curing accelerators of the present invention, exhibited inferior fluidity to the corresponding example that, with the exception of the curing accelerator, comprised the same resin composition. In particular, the comparative examples 4, 5, 9 and 10, in which the precursors to the curing accelerators used in the examples were added separately, exhibited fluidity that was inferior to the examples based on the present invention.

The invention claimed is:

1. A curing accelerator comprising a compound represented by a general formula (I):

[Formula 1]

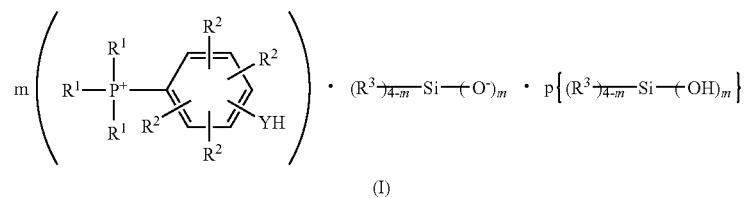

(wherein, each $R^1$ is selected, independently, from the group consisting of a hydrogen atom, and substituted or unsubstituted hydrocarbon groups of 1 to 18 carbon atoms, the $R^1$ groups may be either all the same or different, and two or more $R^1$ groups may be bonded together to form a cyclic structure, each $R^2$ is selected, independently, from the group consisting of a hydrogen atom, a hydroxyl group, and substituted or unsubstituted organic groups of 1 to 18 carbon atoms, the $R^2$ groups may be either all the same or different, and two or more $R^2$ groups may be bonded together to form a cyclic structure, each $R^3$ is selected, independently, from the group consisting of a hydrogen atom, a hydroxyl group, and substituted or unsubstituted organic groups of 1 to 18 carbon atoms, the $R^3$ groups may be either all the same or different, and two or more $R^3$ groups may be bonded together to form a cyclic structure, YH represents an organic group of 0 to 18 carbon atoms containing one or more releasable protons, and may be bonded to one or more groups to form a cyclic structure, m represents an integer from 1 to 4, and p represents a number of 0 or greater).

2. The curing accelerator according to claim 1, wherein YH in the general formula (I) represents a monovalent organic group containing a hydroxyl group or a phenolic hydroxyl group.

3. A curing accelerator comprising a reaction product of an intramolecular phosphonium salt represented by a general formula (Ia) shown below, and a silanol compound (Ib) represented by a general formula shown below:

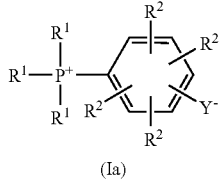

(Ia)

[Formula 2]

(wherein, each $R^1$ is selected, independently, from the group consisting of a hydrogen atom, and substituted or unsubstituted hydrocarbon groups of 1 to 18 carbon atoms, the $R^1$ groups may be either all the same or different, and two or more $R^1$ groups may be bonded together to form a cyclic structure, each $R^2$ is selected, independently, from the group consisting of a hydrogen atom, a hydroxyl group, and substituted or unsubstituted organic groups of 1 to 18 carbon atoms, the $R^2$ groups may be either all the same or different, and two or more $R^2$ groups may be bonded together to form a cyclic structure, $Y^-$ represents an organic group formed by eliminating one proton from an organic group of 0 to 18 carbon atoms containing one or more releasable protons, and may be bonded to one or more $R^2$ groups to form a cyclic structure);

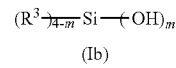

(Ib)

[Formula 3]

(wherein, each $R^3$ is selected, independently, from the group consisting of a hydrogen atom, a hydroxyl group, and substituted or unsubstituted organic groups of 1 to 18 carbon atoms, the $R^3$ groups may be either all the same or different, and two or more $R^3$ groups may be bonded together to form a cyclic structure, and m represents an integer from 1 to 4).

4. The curing accelerator according to claim 3, wherein $Y^-$ in the general formula (Ia) represents a group obtained by eliminating a proton from a monovalent organic group containing a hydroxyl group or a phenolic hydroxyl group.

5. A curable resin composition, comprising one or more of the curing accelerators (A) according to claim 1, and a curable resin (B).

6. The curable resin composition according to claim 5, wherein the curable resin (B) comprises an epoxy resin.

7. The curable resin composition according to claim 5, further comprising a curing agent (C).

8. The curable resin composition according to claim 5, further comprising an inorganic filler (D).

9. The curable resin composition according to claim 6, wherein the epoxy resin comprised within the curable resin (B) comprises one or more epoxy resins selected from the group consisting of biphenyl epoxy resins, stilbene epoxy resins, diphenylmethane epoxy resins, sulfur atom-containing epoxy resins, novolac epoxy resins, dicyclopentadiene epoxy resins, salicylaldehyde epoxy resins, copolymer epoxy resins of a napthol and a phenol, and epoxidized products of aralkyl phenolic resins.

10. The curable resin composition according to claim 7, wherein the curing agent (C) comprises one or more resins selected from the group consisting of aralkyl phenolic resins, dicyclopentadiene phenolic resins, salicylaldehyde phenolic resins, copolymer resins of a benzaldehyde phenolic resin and an aralkyl phenolic resin, and novolac phenolic resins.

11. An electronic parts device comprising an element that has been encapsulated using the curable resin composition according to claim 5.

12. A curable resin composition, comprising one or more of the curing accelerators (A) according to claim 3, and a curable resin (B).

13. The curable resin composition according to claim 12, wherein the curable resin (B) comprises an epoxy resin.

14. The curable resin composition according to claim 12, further comprising a curing agent (C).

15. The curable resin composition according to claim 12, further comprising an inorganic filler (D).

16. The curable resin composition according to claim 13, wherein the epoxy resin comprised within the curable resin (B) comprises one or more epoxy resins selected from the group consisting of biphenyl epoxy resins, stilbene epoxy resins, diphenylmethane epoxy resins, sulfur atom-containing epoxy resins, novolac epoxy resins, dicyclopentadiene epoxy resins, salicylaldehyde epoxy resins, copolymer epoxy resins of a napthol and a phenol, and epoxidized products of aralkyl phenolic resins.

17. The curable resin composition according to claim 14, wherein the curing agent (C) comprises one or more resins selected from the group consisting of aralkyl phenolic resins, dicyclopentadiene phenolic resins, salicylaldehyde phenolic resins, copolymer resins of a benzaldehyde phenolic resin and an aralkyl phenolic resin, and novolac phenolic resins.

18. An electronic parts device comprising an element that has been encapsulated using the curable resin composition according to claim 12.

* * * * *